(12) United States Patent
Ando

(10) Patent No.: US 8,390,394 B2
(45) Date of Patent: Mar. 5, 2013

(54) HIGH FREQUENCY SWITCH

(75) Inventor: Akira Ando, Urayasu (JP)

(73) Assignee: Soshin Electric Co., Ltd., Saku (JP)

( * ) Notice: Subject to any disclaimer, the term of this patent is extended or adjusted under 35 U.S.C. 154(b) by 341 days.

(21) Appl. No.: 12/746,288

(22) PCT Filed: Dec. 18, 2008

(86) PCT No.: PCT/JP2008/073042
§ 371 (c)(1),
(2), (4) Date: Jun. 4, 2010

(87) PCT Pub. No.: WO2009/078456
PCT Pub. Date: Jun. 25, 2009

(65) Prior Publication Data
US 2010/0253445 A1    Oct. 7, 2010

(30) Foreign Application Priority Data

Dec. 19, 2007  (JP) .................................. 2007-327418
Mar. 28, 2008  (JP) .................................. 2008-085927

(51) Int. Cl.
*H01P 1/10* (2006.01)
*H01P 1/15* (2006.01)

(52) U.S. Cl. ........................................ 333/103; 333/104

(58) Field of Classification Search .................. 333/101, 333/103, 104
See application file for complete search history.

(56) References Cited

U.S. PATENT DOCUMENTS

| 5,193,218 | A  | 3/1993  | Shimo |
| 6,070,059 | A  | 5/2000  | Kato et al. |
| 6,847,829 | B2 | 1/2005  | Tanaka et al. |
| 7,075,386 | B2 | 7/2006  | Kearns |
| 2005/0221767 | A1 | 10/2005 | Suga et al. |
| 2010/0253445 | A1 | 10/2010 | Ando |
| 2011/0057745 | A1 | 3/2011  | Ando |
| 2011/0163792 | A1 | 7/2011  | Ando |

FOREIGN PATENT DOCUMENTS

| JP | 60-174534 A1 | 9/1985 |
| JP | 01-033961 B2 | 7/1989 |
| JP | 06-058628 U1 | 8/1994 |
| JP | 2532122 B2 | 6/1996 |
| JP | 09-083206 A1 | 3/1997 |
| JP | 2830319 B2 | 9/1998 |
| JP | 10-335902 A1 | 12/1998 |
| JP | 2962418 B2 | 10/1999 |
| JP | 2003-037521 A1 | 2/2003 |
| JP | 2005-065277 A1 | 3/2005 |
| JP | 3627704 B2 | 3/2005 |
| JP | 2005-295503 A1 | 10/2005 |
| JP | 3823843 B2 | 9/2006 |
| JP | 2009-152749 A1 | 7/2009 |

*Primary Examiner* — Dean O Takaoka
(74) *Attorney, Agent, or Firm* — Burr & Brown

(57) ABSTRACT

Disclosed is a high frequency switch wherein a first switch circuit is connected in series to a first λ/4 signal transmission path connected between an antenna connecting terminal and a transmission terminal. In the first switch circuit, a first λ/4 transmission path and a first parallel resonant circuit, which includes one first PIN diode, are connected in series. In a first inductor of the first parallel resonant circuit, a constant is set so that a resonance frequency of the first parallel resonant circuit and the center frequency of a first antenna switch are the same when the first PIN diode is turned off.

7 Claims, 20 Drawing Sheets

HIGH FREQUENCY SWITCH

BACKGROUND OF THE INVENTION

1. Field of the Invention

The present invention relates to a high frequency switch (RF switch) for switching between high frequency signals, and more particularly to a high frequency switch suitable for use as an antenna switch connected to an antenna, e.g., a TDD (Time Division Duplex) switch or the like.

2. Description of the Related Art

Conventional high frequency switches such as antenna switches include a microwave switch disclosed in Patent Document 1 and a transmission and reception switching device disclosed in Patent Document 2, for example.

The microwave switch disclosed in Patent Document 1 has PIN diodes inserted in series and parallel in a signal line. Forward currents are passed through the PIN diodes to turn them on, and the PIN diodes are reversely biased to turn them off, thereby switching between high frequency signals.

The transmission and reception switching device disclosed in Patent Document 2 employs a circuit scheme wherein a switch is constructed of transmission lines and PIN diodes or the like which are connected in series to the transmission lines, the transmission lines and the PIN diodes being connected parallel to a signal transmission line.

There is also known an example wherein a choke coil is connected for the purpose of disconnecting bias circuits for PIN diodes at high frequencies when the PIN diodes are turned off (see Patent Document 3, for example).

Patent Document 1: Japanese Patent No. 2532122
Patent Document 2: Japanese Patent No. 2830319
Patent Document 3: Japanese Patent Publication No. 01-033961

SUMMARY OF THE INVENTION

There are two types of transmission and reception schemes (a first transmission and reception scheme and a second transmission and reception scheme) using high frequency switches, as described below.

According to the first transmission and reception scheme, as shown in FIG. 19, a transmission amplifier 108 and an isolator 111 are connected to a transmission signal line 106 between a transceiver 100 and a transmission and reception antenna 102 (or via a bandpass filter 104), and a reception amplifier 112 is connected to a reception signal line 110 between the transceiver 100 and the transmission and reception antenna 102 (or via the bandpass filter 104). A high frequency switch 114 is connected to the junction between the transmission signal line 106 and the reception signal line 110.

According to the second transmission and reception scheme, as shown in FIG. 20, a transmission amplifier 108 is connected to a transmission signal line 106, and a reception amplifier 112 and a high frequency switch 114 are connected to a reception signal line 110. A circulator 116 is connected to the junction between the transmission signal line 106 and the reception signal line 110.

The above high frequency switch comprises a reflective high frequency switch which makes a VSWR (voltage standing wave ratio) infinite for total reflection when a switch on the receiver side is turned off. In this case, the high frequency switch becomes unstable tending to cause oscillation due to an input mismatch with the reception amplifier. Such a problem may be solved by inserting another isolator between the reception amplifier and the high frequency switch. However, the isolator thus inserted is liable to cause a large loss, which makes the receiver sensitivity worse at a low level receive signal.

Patent Documents 1 and 2 suffer the following problems:

The microwave switch disclosed in Patent Document 1 switches between signals by turning on and off the PIN diodes inserted in the signal line. However, a large insertion loss is caused due to the forward residual resistance which is present when the PIN diodes are turned on, and the remnant capacitance and parallel resistance which are present when the PIN diodes are turned off. While the isolation provided when the PIN diodes are turned off can be expanded by increasing the number of PIN diodes that are inserted parallel, the increased number of PIN diodes results in an increased insertion loss. Though the insertion loss caused when the PIN diodes are turned on can be reduced, the isolation is reduced in accordance with the number of PIN diodes.

The transmission and reception switching device disclosed in Patent Document 2 provides a switch that is constructed of a signal transmission line, transmission lines and PIN diodes connected in series to the transmission line, the transmission lines and the PIN diodes being connected parallel to the signal transmission line. In the transmission and reception switching device, an insertion loss is caused due to the forward residual resistance of the PIN diodes (which are turned on by the forward bias) when the switching circuit is turned on. Furthermore, the transmission and reception switching device causes the phase characteristic of a $\lambda/4$ transmission line to suffer an error due to the remnant capacitance of the PIN diodes (which are turned off by the reverse bias) when the switching circuit is turned off. In other words, the transmission and reception switching device is problematic in that the central frequencies at the time the switching circuit is turned on and off deviate from each other. As a result, the passband provided when the switch is turned on and the isolation band provided when the switch is turned off deviate from each other. Moreover, when the switching circuit is turned off, the isolation is reduced due to the forward residual resistance of the PIN diodes.

The present invention has been made in view of the above problems. It is an object of the present invention to provide a high frequency switch which does not cause the phase characteristic of a $\lambda/4$ transmission line to suffer an error, can bring the passband provided when switch circuits are turned on and the isolation band provided when the switch circuits are turned off into conformity with each other, and is capable of appropriately minimizing the insertion loss caused when the switch circuits are turned on and maximizing the isolation provided when the switch circuits are turned off in a band that is used by the high frequency switch.

Another object of the present invention is to provide a high frequency switch which does not cause an input mismatch with a reception amplifier even when a switched on receiver side is turned off, thereby preventing the reception amplifier from being unstable in operation.

According to a first aspect of the present invention, a high frequency switch having an operating frequency band with a central frequency fo and a wavelength $\lambda$ corresponding to the central frequency fo, comprises a switch circuit connected parallel to a $\lambda/4$ signal transmission line for transmitting a signal, the switch circuit comprising a $\lambda/4$ transmission line and a parallel resonant circuit including one or more PIN diodes, the $\lambda/4$ transmission line and the parallel resonant circuit being connected in series to each other, and the parallel resonant circuit has a constant established such that the resonant frequency thereof when the one or more PIN diodes is turned off is the same as the central frequency fo.

With the above arrangement, the phase characteristic of the $\lambda/4$ transmission line is free of an error, thereby getting coincidence between the passband of the switch circuit when it is turned on and the isolation band thereof when it is turned off. In other words, the high frequency switch is capable of appropriately minimizing the insertion loss caused when the switch circuit is turned on and maximizing the isolation provided when the switch circuit is turned off in a band that is used by the high frequency switch. As a result, the loss of a transmission signal caused by the switch circuit is reduced, and an appropriate amount of attenuation at the time the switch circuit is turned off is secured.

In the first aspect, the parallel resonant circuit may include a plurality of PIN diodes. With this arrangement, the insertion loss of the switch circuit at the time a signal is transmitted can further be reduced without degrading the isolation at the time the signal is cut off.

In the first aspect, the $\lambda/4$ transmission line may have a characteristic impedance which is smaller than a characteristic impedance of the $\lambda/4$ signal transmission line. In this case, the isolation at the time the switch is turned off can be expanded.

In the first aspect, the $\lambda/4$ transmission line may have a characteristic impedance which is greater than a characteristic impedance of the $\lambda/4$ signal transmission line. In this case, the insertion loss at the time the switch is turned on can be minimized.

According to a second aspect of the present invention, a high frequency switch includes a first switch circuit connected parallel to a first $\lambda/4$ signal transmission line for transmitting signal from a transmission terminal, the first switch circuit comprising a first $\lambda/4$ transmission line and a circuit including one or more first PIN diodes, the first $\lambda/4$ transmission line and the circuit being connected in series to each other, and a second switch circuit connected parallel to a second $\lambda/4$ signal transmission line for receiving signal by a reception terminal, the second switch circuit comprising a second $\lambda/4$ transmission line and a circuit including one or more second PIN diodes, the second $\lambda/4$ transmission line and the circuit being connected in series to each other, the high frequency switch comprising a third switch circuit connected parallel to a third $\lambda/4$ signal transmission line connected at least between the reception terminal and the second $\lambda/4$ signal transmission line, the third switch circuit comprising a third $\lambda/4$ transmission line and a circuit including one or more third PIN diodes, the third $\lambda/4$ transmission line and the circuit being connected in series to each other, and a resistor for forming a terminating resistance, the resistor connected parallel to the third PIN diode.

With the above arrangement, when the switches on a receiver side (the second switch circuit and the third switch circuit) are turned off, no impedance mismatch occurs with a reception amplifier that is connected to the reception terminal, thus preventing the reception amplifier from becoming unstable in operation.

In the second aspect, the high frequency switch may comprise a fourth switch circuit connected parallel to a fourth $\lambda/4$ signal transmission line connected between the transmission terminal and the first $\lambda/4$ signal transmission line, the fourth switch circuit comprising a fourth $\lambda/4$ transmission line and a circuit including one or more fourth PIN diodes, the fourth $\lambda/4$ transmission line and the circuit being connected in series to each other, and a resistor for forming a terminating resistance, the resistor connected parallel to the fourth PIN diode.

With the above arrangement, when the switches on a transmitter side (the first switch circuit and the fourth switch circuit) are turned off, the terminating resistor is brought into connection to the transmission terminal. In this case, the impedance of the transmitter side at the time the switches are turned off is of the value of the terminating resistor (e.g., 50 ohms), making it possible to achieve impedance matching with other circuits.

In the second aspect, the high frequency switch has an operating frequency band with a central frequency fo and a wavelength $\lambda$ corresponding to the central frequency fo, wherein the first switch circuit may comprise the first $\lambda/4$ transmission line and a parallel resonant circuit including the one or more first PIN diodes, the first $\lambda/4$ transmission line and the parallel resonant circuit being connected in series to the first $\lambda/4$ signal transmission line, the second switch circuit may comprise the second $\lambda/4$ transmission line and a parallel resonant circuit including the one or more second PIN diodes, the second $\lambda/4$ transmission line and the parallel resonant circuit being connected in series to the second $\lambda/4$ signal transmission line, and the third switch circuit may comprise the third $\lambda/4$ transmission line and a parallel resonant circuit including the one or more third PIN diodes, the third $\lambda/4$ transmission line and the parallel resonant circuit being connected in series to the third $\lambda/4$ signal transmission line, each of the parallel resonant circuits having a constant established such that the resonant frequency thereof when the corresponding one of the PIN diodes is turned off is the same as the central frequency fo.

With the above arrangement, the phase characteristic of the $\lambda/4$ transmission line is free of an error, thereby getting coincidence between the passband of the switch circuit when it is turned on and the isolation band thereof when it is turned off. The high frequency switch is capable of appropriately minimizing the insertion loss caused when the switch circuit is turned on and maximizing the isolation provided when the switch circuit is turned off in a band that is used by the high frequency switch.

In the second aspect, the first switch circuit may comprise the first $\lambda/4$ transmission line and a parallel resonant circuit including the one or more first PIN diodes, the first $\lambda/4$ transmission line and the parallel resonant circuit being connected in series to the first $\lambda/4$ signal transmission line, the second switch circuit may comprise the second $\lambda/4$ transmission line and a parallel resonant circuit including the one or more second PIN diodes, the second $\lambda/4$ transmission line and the parallel resonant circuit being connected in series to the second $\lambda/4$ signal transmission line, the third switch circuit may comprise the third $\lambda/4$ transmission line and a parallel resonant circuit including the one or more third PIN diodes, the third $\lambda/4$ transmission line and the parallel resonant circuit being connected in series to the third $\lambda/4$ signal transmission line, and the fourth switch circuit may comprise the fourth $\lambda/4$ transmission line and a parallel resonant circuit including the one or more fourth PIN diodes, the fourth $\lambda/4$ transmission line and the parallel resonant circuit being connected in series to the fourth $\lambda/4$ signal transmission line, each of the parallel resonant circuits having a constant established such that the resonant frequency thereof when the corresponding one of the PIN diodes is turned off is the same as the central frequency fo.

In the second aspect, the parallel resonant circuit may include a plurality of PIN diodes. With this arrangement, the insertion loss of the switch circuits at the time a signal is transmitted can further be reduced without degrading the isolation at the time the signal is cut off.

In the second aspect, the $\lambda/4$ transmission lines may have a characteristic impedance which is smaller than a characteristic impedance of the λ/4 signal transmission lines. In this case, the isolation at the time the switch is turned off can be expanded.

In the second aspect, the λ/4 transmission lines may have a characteristic impedance which is greater than a characteristic impedance of the λ/4 signal transmission lines. In this case, the insertion loss at the time the switch is turned on can be minimized.

With the high frequency switch according to the present invention, as described above, the phase characteristic of the λ/4 transmission line is free of an error, thereby getting coincidence between the passband of the switch circuit when it is turned on and the isolation band thereof when it is turned off. The high frequency switch is capable of appropriately minimizing the insertion loss caused when the switch circuit is turned on and maximizing the isolation provided when the switch circuit is turned off in a band that is used by the high frequency switch.

With the high frequency switch according to the present invention, furthermore, when the switches on the receiver side are turned off, no impedance mismatch occurs with the reception amplifier, thus preventing the reception amplifier from becoming unstable in operation.

BRIEF DESCRIPTION OF THE DRAWINGS

FIG. 6 is a diagram showing an equivalent circuit of the first antenna switch when the first switch circuit is turned off and the second switch circuit is turned on;

FIG. 17 is a diagram showing an equivalent circuit of the fifth antenna switch when a first switch circuit and a fourth switch circuit are turned off and a second switch circuit and a third switch circuit are turned on;

DETAILED DESCRIPTION OF THE INVENTION

Embodiments wherein a high frequency switch according to the present invention is applied, for example, to an antenna switch will be described below with reference to FIGS. 1 through 18. It is assumed that λ represents a wavelength corresponding to the central frequency of an operating frequency band of the switch, and refers to a wavelength in transmission lines described below.

Figure 1:
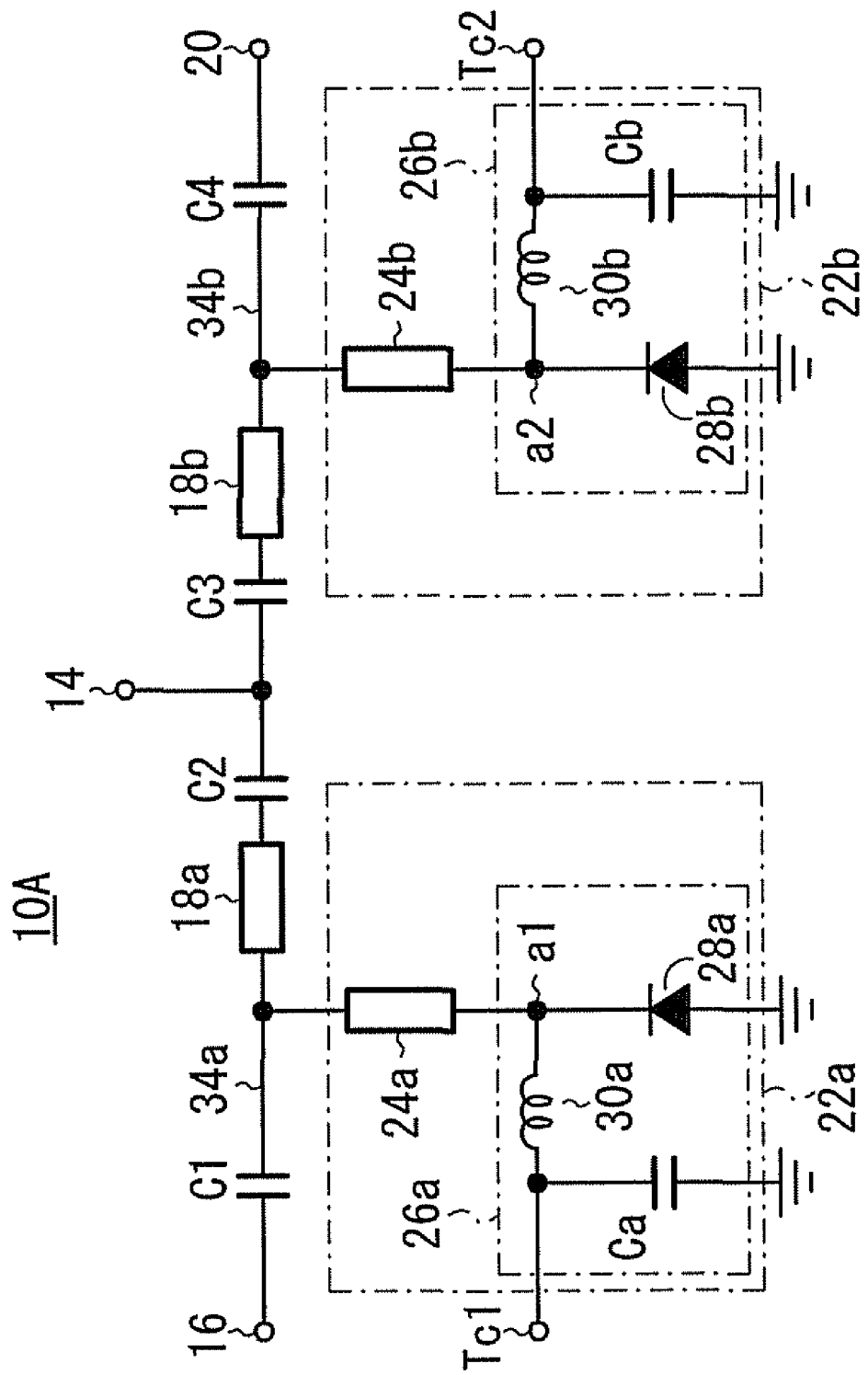
FIG. 1 is a circuit diagram showing a configuration of a first antenna switch.

As shown in FIG. 1, an antenna switch according to a first embodiment (hereinafter referred to as a first antenna switch 10A) comprises a first λ/4 signal transmission line 18a connected between an antenna connection terminal 14 and a transmission terminal 16, a second λ/4 signal transmission line 18b connected between the antenna connection terminal 14 and a reception terminal 20, a first switch circuit 22a connected parallel to the first λ/4 signal transmission line 18a, and a second switch circuit 22b connected parallel to the second λ/4 signal transmission line 18b. Capacitors C1 through C4 are connected respectively between the transmission terminal 16 and the first λ/4 signal transmission line 18a, between the first λ/4 signal transmission line 18a and the antenna connection terminal 14, between the antenna connection terminal 14 and the second λ/4 signal transmission line 18b, and between the second λ/4 signal transmission line 18b and the reception terminal 20. The capacitors C1 through C4 are capacitors for blocking currents for turning on and off PIN diodes, to be described later, and operate as a short circuit at high frequencies.

The first switch circuit 22a is connected between a signal line between the capacitor C1 and the first λ/4 signal transmission line 18a and GND (ground). The first switch circuit 22a comprises a series-connected circuit of a first λ/4 transmission line 24a and a first parallel resonant circuit 26a which are connected in series to each other at a first junctional.

The first parallel resonant circuit 26a comprises a first PIN diode 28a connected between the first junctional and GND, a first inductor 30a connected between the first junctional and a first control terminal Tc1, and a first capacitor Ca connected between the first control terminal Tc1 and GND. The first capacitor Ca operates as a capacitor for blocking currents for turning on and off the first PIN diode 28a.

To the first control terminal Tc1, there are applied a forward bias voltage Vc1 for passing a forward current through the first PIN diode 28a to turn on the first PIN diode 28a and a reverse bias voltage Vc2 for reversely biasing the first PIN diode 28a to turn off the first PIN diode 28a.

As with the first switch circuit 22a described above, the second switch circuit 22b is connected between a signal line between the second λ/4 signal transmission line 18b and the capacitor C4 and GND (ground). The second switch circuit 22b comprises a series-connected circuit of a second λ/4 transmission line 24b and a second parallel resonant circuit 26b which are connected in series to each other at a second junction a2.

The second parallel resonant circuit 26b comprises a second PIN diode 28b connected between the second junction a2 and GND, a second inductor 30b connected between the second junction a2 and a second control terminal Tc2, and a second capacitor Cb connected between the second control terminal Tc2 and GND. The second capacitor Cb operates as a capacitor for blocking currents for turning on and off the second PIN diode 28b.

To the second control terminal Tc2, there are applied the forward bias voltage Vc1 for passing a forward current through the second PIN diode 28b to turn on the second PIN diode 28b and the reverse bias voltage Vc2 for reversely biasing the second PIN diode 28b to turn off the second PIN diode 28b. When the forward bias voltage Vc1 is applied to the first control terminal Tc1, the reverse bias voltage Vc2 is applied to the second control terminal Tc2. When the reverse bias voltage Vc2 is applied to the first control terminal Tc1, the forward bias voltage Vc1 is applied to the second control terminal Tc2. The reverse bias voltage Vc2 which is applied to the first control terminal Tc1 and the reverse bias voltage Vc2 which is applied to the second control terminal Tc2 may have different voltage levels.

Circuit operation of the first antenna switch 10A will be described below with reference to FIGS. 2 through 6.

The first switch circuit 22a will primarily be described below. When the forward bias voltage Vc1 is applied to the first control terminal Tc1, the first PIN diode 28a is turned on. At this time, the first switch circuit 22a is represented by an equivalent circuit shown in FIG. 2A. Specifically, a circuit comprising an inductance La and an ON resistance Ro of the first PIN diode 28a which are connected parallel to each other is connected in series between the first λ/4 transmission line 24a and GND.

Conversely, when the reverse bias voltage Vc2 is applied to the first control terminal Tc1, the first PIN diode 28a is turned off. At this time, the first switch circuit 22a is represented by an equivalent circuit shown in FIG. 2B. Specifically, a parallel resonant circuit comprising an inductance La, a parasitic capacitance Cf due to the depletion layer of the first PIN diode 28a, and an parallel resistance Rf of the first PIN diode 28a which are connected parallel to each other is connected in series between the first λ/4 transmission line 24a and GND.

In the first antenna switch 10A, the inductance La has a value established such that the central frequency fo of the first antenna switch 10A and the resonant frequency of the parallel resonant circuit that is made up of the parasitic capacitance Cf, the parallel resistance Rf, and the inductance La are in agreement with each other.

The ON resistance Ro is generally of about 1 ohm or less. Since the ON resistance Ro can be expressed as Ro<<2πfoLa, the first switch circuit 22a can be represented by an equivalent circuit shown in FIG. 3A in the vicinity of the central frequency fo when the first PIN diode 28a is turned on, and can be represented by an equivalent circuit shown in FIG. 3B in the vicinity of the central frequency fo when the first PIN diode 28a is turned off.

Figure 4:
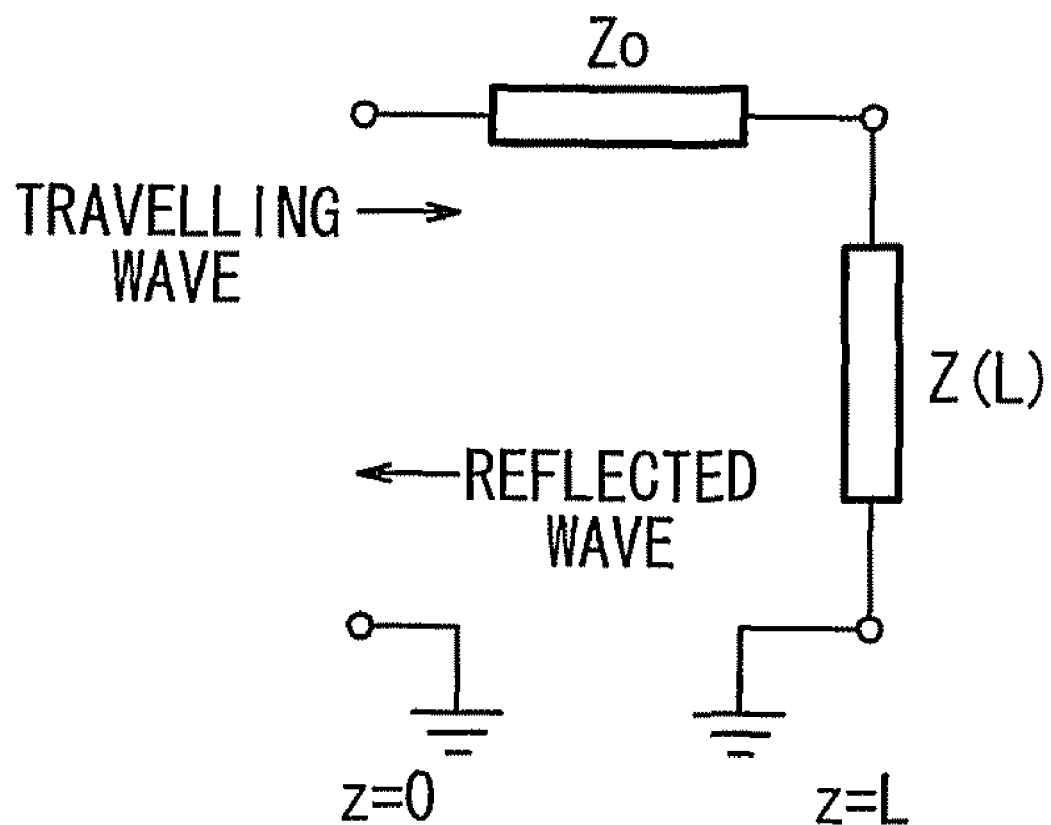
FIG. 4 is a diagram illustrative of the relationship between input and output impedances of a transmission line.

It is assumed that, as shown in FIG. 4, a transmission line z=L is terminated by the load of an impedance Z(L).

If the transmission line has a characteristic impedance Zo, a travelling wave is represented by $Ae^{-\gamma z}$, and a reflected wave is represented by $Be^{-\gamma z}$ (γ indicates a propagation constant), then a voltage V(z) and a current I(z) at a reference point z are expressed by the following equations:

$$V(z)=Ae^{-\gamma z}+Be^{\gamma z}$$

$$I(z)=(A/Zo)e^{-\gamma z}-(B/Zo)e^{\gamma z}$$

Therefore, the impedance Z(L) at z=L is expressed by the following equation:

$$Z(L) = V(L)/I(L)$$
$$= Zo\{(Ae^{-\gamma L} + Be^{\gamma L})/(Ae^{-\gamma L} - Be^{\gamma L})\}$$

A reflection coefficient Γ(L) has a relationship expressed by the following equation (a):

$$\Gamma(L) = (Be^{\gamma L})/(Ae^{-\gamma L}) \qquad (a)$$
$$= (B/A)e^{2\gamma L}$$
$$= \{Z(L) - Zo\}/\{Z(L) + Zo\}$$

An impedance Z(0) of the load as seen at z=0 is expressed by the following equation (b):

$$Z(0)=Zo\{(A+B)/(A-B)\} \qquad (b)$$

From the equation (a), $$B/A=[\{Z(L)-Zo\}/\{Z(L)+Zo\}]e^{-2\gamma L}$$

By substituting this equation into the equation (b), the following equation (c) is obtained:

$$Z(0)/Zo=[Z(L)+Zo \tan h\gamma L]/[Zo+Z(L)\tan h\gamma L] \qquad (c)$$

where γ=α+jβ (α represents an attenuation constant and β a phase constant expressed by β=2π/λ).

Since α=0 and γ=jβ for a lossless line, the equation (c) can be modified into the following equation (d):

$$Z(0)/Zo=[Z(L)+jZo \tan \beta L]/[Zo+jZ(L)\tan \beta L] \qquad (d)$$

By substituting L=λ/4 into the equation (d), the following equation (e) is obtained:

$$Z(0)/Zo=Zo/Z(L)$$

$$Z(0)=Zo^2/Z(L) \qquad (e)$$

Inasmuch as Z(L) is a low resistance of about 1 ohm or less when the first PIN diode 28a is turned on, the impedance (in this case, Z(0)) of the first λ/4 transmission line 24a on the signal line side is of a large value, and the signal line is ideally in an open state, as can be understood from the equation (e). Conversely, inasmuch as Z(L) is a high resistance of about 10 k ohms or more when the first PIN diode 28a is turned off, the impedance (in this case, Z(0)) of the first λ/4 transmission line 24a on the signal line side is of a small value, and the signal line is ideally in a short-circuited state, as can be understood from the equation (e).

The second switch circuit 22b behaves similarly. When the second PIN diode 28b is turned on, the impedance of the second λ/4 transmission line 24b on the signal line side is of a large value, and the signal line is ideally in an open state. Conversely, when the second PIN diode 28b is turned off, the impedance of the second λ/4 transmission line 24b on the signal line side is of a small value, and the signal line is ideally in a short-circuited state.

Figure 5:
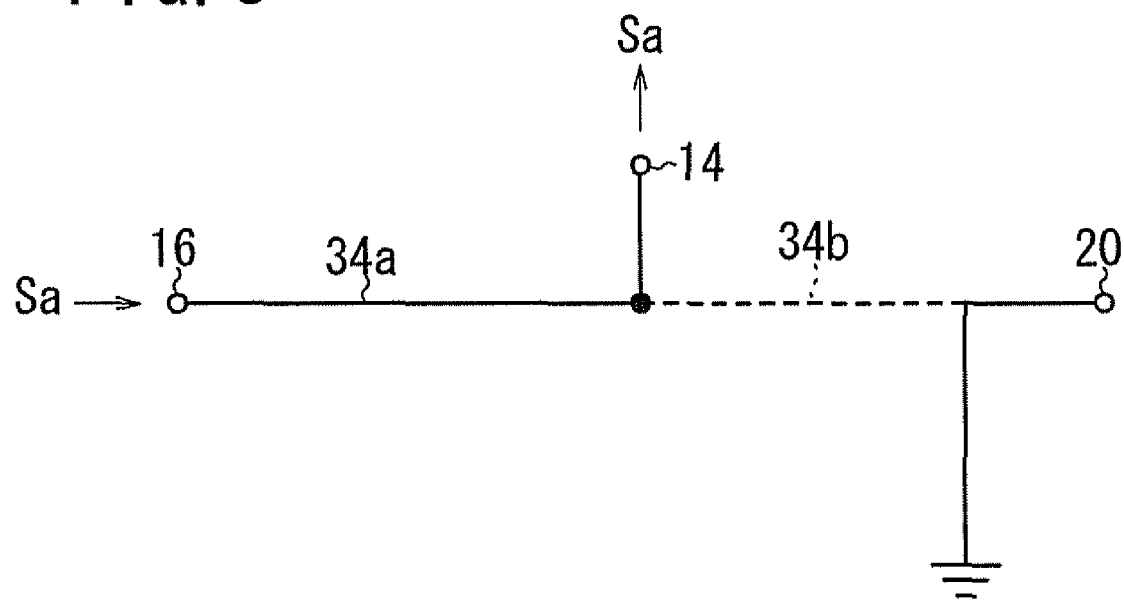
FIG. 5 is a diagram showing an equivalent circuit of the first antenna switch when the first switch circuit is turned on and a second switch circuit is turned off.

Therefore, when the forward bias voltage Vc1 is applied to the first control terminal Tc1, turning on the first PIN diode 28a, and the reverse bias voltage Vc2 is applied to the second control terminal Tc2, turning off the second PIN diode 28b, the first antenna switch 10A is represented by an equivalent circuit shown in FIG. 5 wherein only the transmission terminal 16 is connected to the antenna connection terminal 14 at high frequencies. A transmission signal Sa supplied to the transmission terminal 16 is thus transmitted via the antenna connection terminal 14. In other words, a first signal line 34a from the transmission terminal 16 to the antenna connection terminal 14 serves as a signal transmission side, and a second signal line 34b from the reception terminal 20 to the antenna connection terminal 14 serves as a signal cutoff side.

Figure 6:
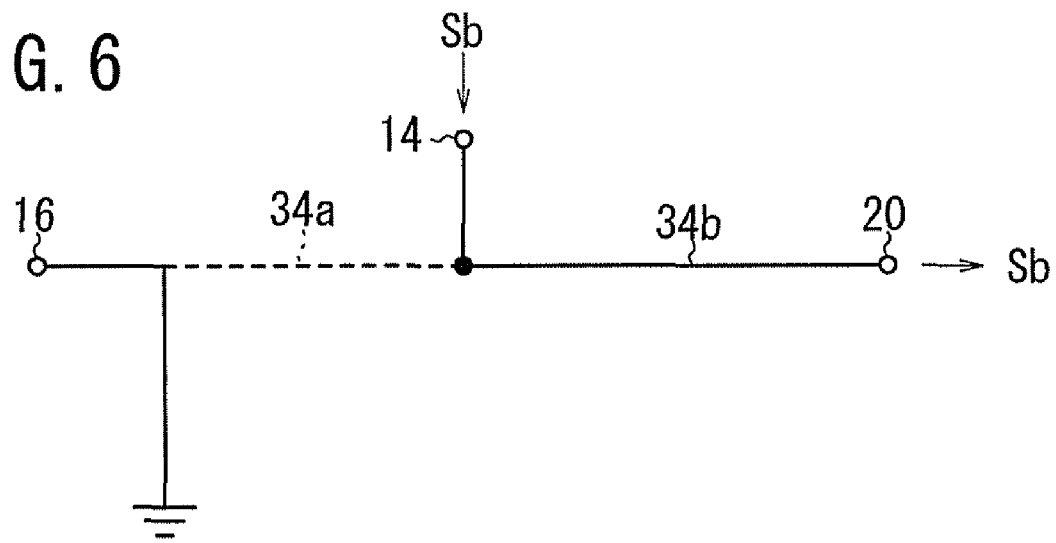

Conversely, when the reverse bias voltage Vc2 is applied to the first control terminal Tc1, turning off the first PIN diode 28a, and when the forward bias voltage Vc1 is applied to the second control terminal Tc2, turning on the second PIN diode 28b, the first antenna switch 10A is represented by an equivalent circuit shown in FIG. 6 wherein only the reception terminal 20 is connected to the antenna connection terminal 14 at high frequencies. A reception signal Sb received by the antenna is thus supplied to the antenna connection terminal 14 and output from the reception terminal 20. In other words, the first signal line 34a from the transmission terminal 16 to the antenna connection terminal 14 serves as a signal cutoff side, and the second signal line 34b from the reception terminal 20 to the antenna connection terminal 14 serves as a signal transmission side.

Figure 2A:
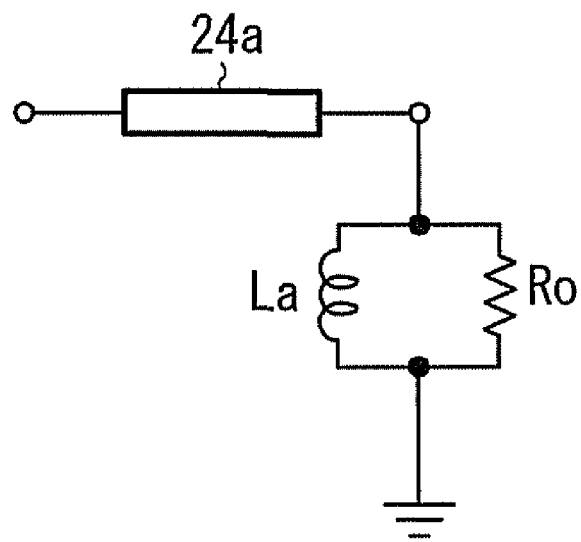
FIG. 2A is a diagram showing an equivalent circuit of a first switch circuit of the first antenna switch when a first PIN diode is turned on, and FIG. 2B is a diagram showing an equivalent circuit of the first switch circuit when the first PIN diode is turned off.
Figure 2B:
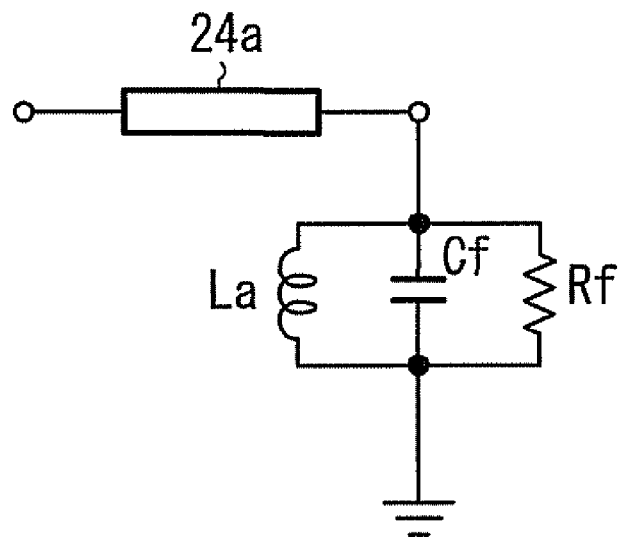
Figure 3A:
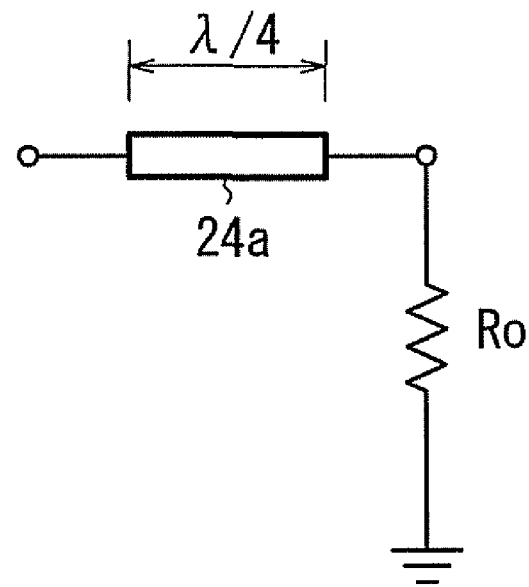
FIG. 3A is a diagram showing an equivalent circuit of the first switch circuit in the vicinity of a central frequency when the first PIN diode is turned on, and FIG. 3B is a diagram showing an equivalent circuit of the first switch circuit in the vicinity of a central frequency when the first PIN diode is turned off.
Figure 3B:
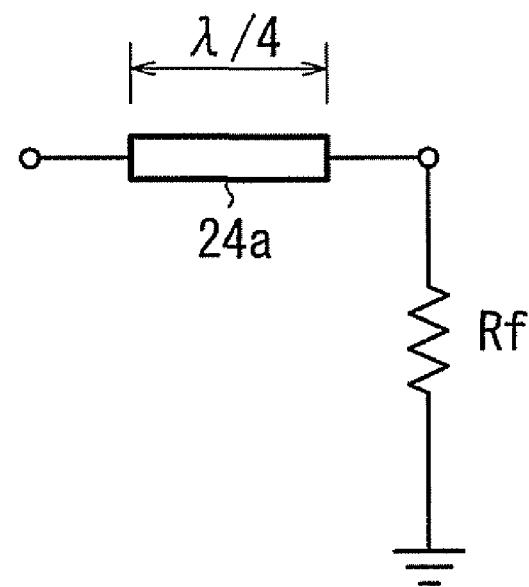

If the first parallel resonant circuit 26a is dispensed with and only the first PIN diode 28a is connected, then the first switch circuit 22a is not represented by the equivalent circuit shown in FIG. 3B in the vicinity of the central frequency fo when the PIN diode 28a is turned off, but the parasitic capacitance Cf remains, as shown in FIG. 2B, shifting the resonant frequency into a low frequency range. As a result, the phase characteristic of the first λ/4 transmission line 24a suffers an error, thereby causing a loss.

With the first antenna switch 10A, the constant of the first inductor 30a of the first parallel resonant circuit 26a is adjusted to equalize the resonant frequency of the first parallel resonant circuit 26a at the time the first PIN diode 28a is turned off with the central frequency fo of the first antenna switch 10A. Similarly, the constant of the second inductor 30b of the second parallel resonant circuit 26b is adjusted to equalize the resonant frequency of the second parallel resonant circuit 26b at the time the second PIN diode 28b is turned off with the central frequency fo of the first antenna switch 10A.

Since the ON resistance Ro of the PIN diode is expressed as Ro<<2πfoLa, only the ON resistance Ro is connected to GND of the first λ/4 transmission line 24a when the first PIN diode 28a is turned on, and only the parallel resistance Rf is connected to GND of the first λ/4 transmission line 24a when the first PIN diode 28a is turned off, as shown in FIGS. 3A and 3B. Consequently, the resonant frequencies of the first λ/4 transmission line 24a at the time the first PIN diode 28a is turned on and off do not deviate from each other.

With the first antenna switch 10A, therefore, the phase characteristics of the first λ/4 transmission line 24a and the second λ/4 transmission line 24b do not suffer an error, and the passband at the time the switch circuits are turned on and the isolation band at the time the switch circuits are turned off are held in conformity with each other. In other words, the first antenna switch 10A is capable of appropriately minimizing the insertion loss caused when the switch circuits are turned on and maximizing the isolation provided when the switch circuits are turned off in a band that is used by the antenna switch. As a result, the loss of a transmission signal caused in the switch circuits is reduced, and an appropriate amount of attenuation at the time the switch circuits are turned off is secured.

Modifications of the first antenna switch 10A will be described below with reference to FIGS. 7 and 8.

Figure 7:
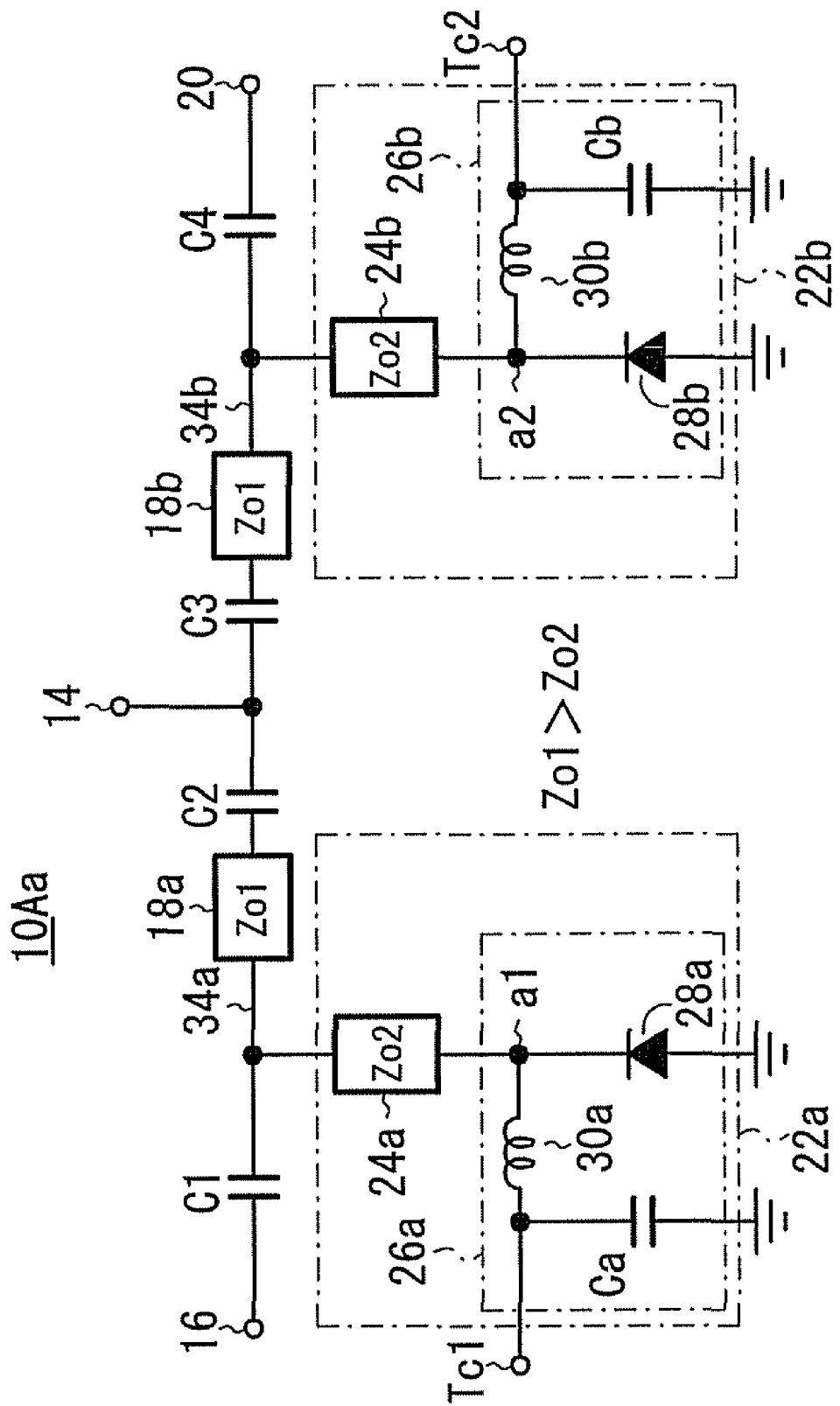
FIG. 7 is a circuit diagram showing a configuration of a first modification of the first antenna switch.

As shown in FIG. 7, an antenna switch 10Aa according to a first modification resides in that respective characteristic impedances Zo2 of the first λ/4 transmission line 24a and the second λ/4 transmission line 24b are lower than respective characteristic impedances Zo1 (e.g., 50 ohms) of the first λ/4 signal transmission line 18a and the second λ/4 signal transmission line 18b (Zo1>Zo2).

Operation of the antenna switch 10Aa can be explained based on the above equation (e).

When the first PIN diode 28a, for example, is turned off, if the parallel resistance Rf=Z(L)=10 k ohms and the characteristic impedance Zo of the first λ/4 transmission line 24a=50 ohms, then the impedance Z(0) at the end on the first signal line side of the first λ/4 transmission line 24a is Z(0)=0.25 ohm.

Since the characteristic impedance of the first λ/4 transmission line 24a of the antenna switch 10Aa is lower than the characteristic impedance (in this case, 50 ohms) of the first λ/4 signal transmission line 18a, when the characteristic impedance Zo of the first λ/4 transmission line 24a is Zo=25 ohms, the impedance Z(0) at the end on the first signal line side is Z(0)=0.0625 ohm.

The impedance at the end on the first signal line 34a side of the first λ/4 transmission line 24a is smaller than when the characteristic impedance Zo2 of the first λ/4 transmission line 24a and the characteristic impedance Zo1 of the first λ/4 signal transmission line 18a are the same as each other. The switch circuit thus approaches an ideal short-circuited state.

With the antenna switch 10Aa, therefore, the isolation at the time the first PIN diode 28a and the second PIN diode 28b are turned off, in particular, the isolation between the antenna connection terminal 14 and the transmission terminal 16 or the isolation between the antenna connection terminal 14 and the reception terminal 20 is expanded for efficiently cutting off a reception signal upon transmission and a transmission signal upon reception.

Figure 8:
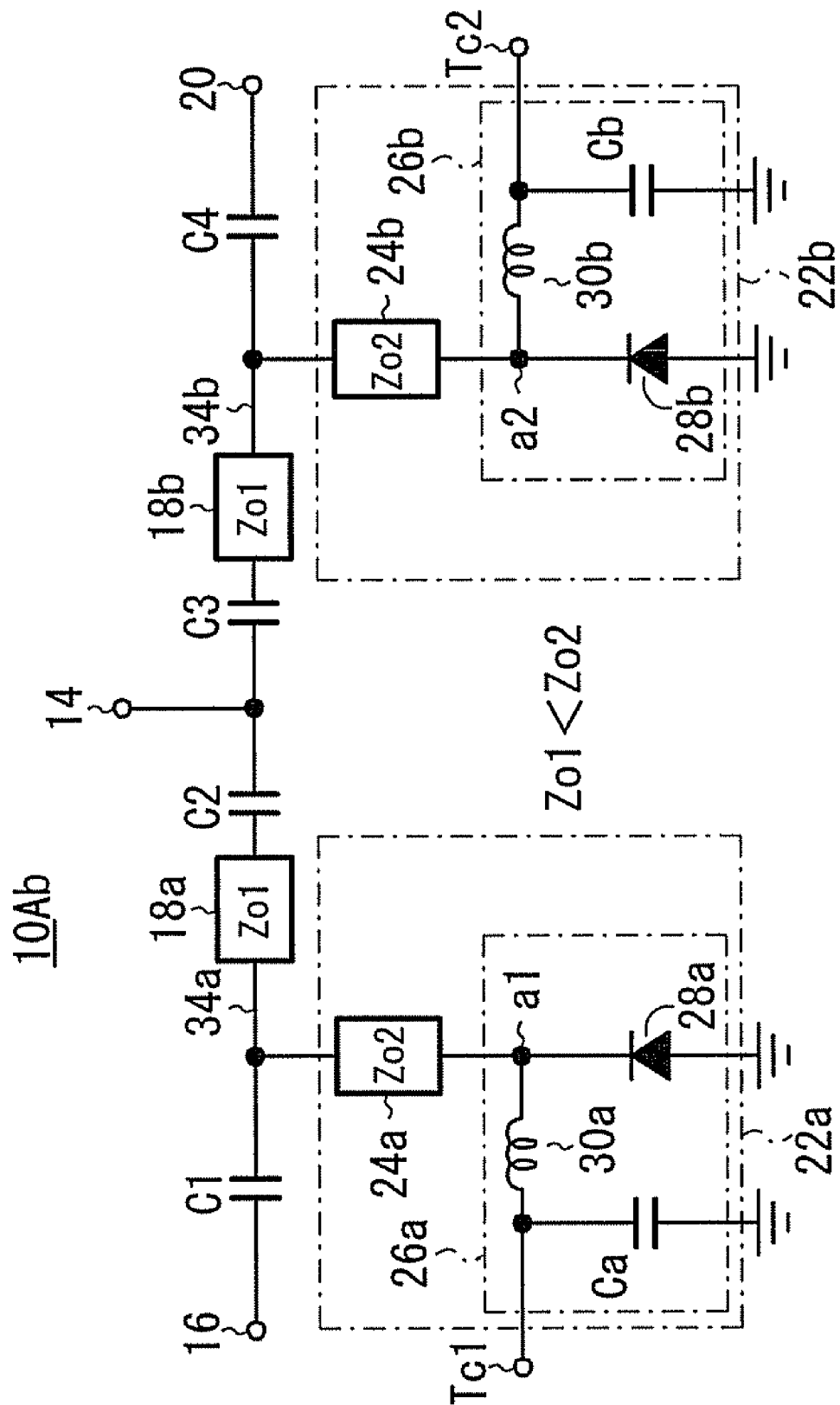
FIG. 8 is a circuit diagram showing a configuration of a second modification of the first antenna switch.

As shown in FIG. 8, an antenna switch 10Ab according to a second modification resides in that respective characteristic impedances Zo2 of the first λ/4 transmission line 24a and the second λ/4 transmission line 24b are higher than respective characteristic impedances Zo1 (e.g., 50 ohms) of the first λ/4 signal transmission line 18a and the second λ/4 signal transmission line 18b (Zo1<Zo2).

Operation of the antenna switch 10Ab can also be explained based on the above equation (e).

When the first PIN diode 28a, for example, is turned on, if the ON resistance Ro=Z(L)=1 ohm and the characteristic impedance Zo of the first λ/4 transmission line 24a=50 ohms, then the impedance Z(0) at the end on the first signal line side of the first λ/4 transmission line 24a is Z(0)=2500 ohms.

Since the characteristic impedance of the first λ/4 transmission line 24a of the antenna switch 10Ab is higher than the characteristic impedance (in this case, 50 ohms) of the first λ/4 signal transmission line 18a, when the characteristic impedance Zo of the first λ/4 transmission line 24a is Zo=100 ohms, the impedance Z(0) at the end on the first signal line side is Z(0)=10000 ohms.

The impedance at the end on the first signal line 34a side of the first λ/4 transmission line 24a is greater than when the characteristic impedance Zo2 of the first λ/4 transmission line 24a and the characteristic impedance Zo1 of the first λ/4 signal transmission line 18a are the same as each other. The switch circuit thus approaches an ideal open state.

The antenna switch 10Ab is thus capable of minimizing the insertion loss caused when the first PIN diode 28a and the second PIN diode 28b are turned on, in particular, the insertion loss between the antenna connection terminal 14 and the transmission terminal 16 or the insertion loss between the antenna connection terminal 14 and the reception terminal 20, for efficiently transferring a transmission signal and a reception signal.

As described above, the antenna switch 10Aa is effective to expand the isolation of the signal lines wherein the PIN diodes are turned off, and the antenna switch 10Ab is effective to reduce the insertion loss of the signal lines wherein the PIN diodes are turned on. Which one of the configurations is to be employed may be determined depending on demands, specifications, etc.

An antenna switch according to a second embodiment (hereinafter referred to as a second antenna switch 10B) will be described below with reference to FIG. 9.

Figure 9:
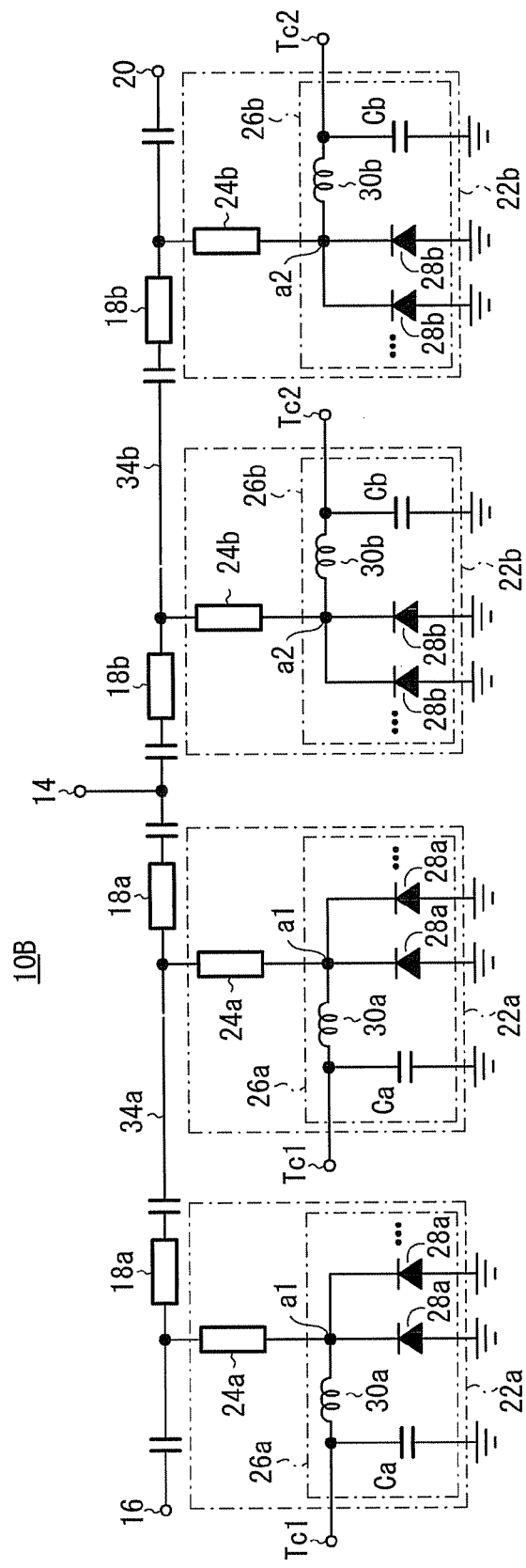
FIG. 9 is a circuit diagram showing a configuration of a second antenna switch.

As shown in FIG. 9, the second antenna switch 10B is of a configuration substantially similar to the first antenna switch 10A described above, but is different therefrom as follows:

Two first λ/4 signal transmission lines 18a are connected between the antenna connection terminal 14 and the transmission terminal 16, and two second λ/4 signal transmission lines 18b are connected between the antenna connection terminal 14 and the reception terminal 20.

First switch circuits 22a are connected in association with the respective first λ/4 signal transmission lines 18a, and similarly, second switch circuits 22b are connected in association with the respective second λ/4 signal transmission lines 18b.

Furthermore, the first parallel resonant circuit 26a of each of the first switch circuits 22a has a plurality of parallel first PIN diodes 28a, and the second parallel resonant circuit 26b of each of the second switch circuits 22b has a plurality of parallel second PIN diodes 28b.

In this case also, the constant of the first inductor 30a of the first parallel resonant circuit 26a is adjusted to equalize the resonant frequency of the first parallel resonant circuit 26a at the time the first PIN diode 28a is turned off with the central frequency of the second antenna switch 10B. Similarly, the constant of the second inductor 30b of the second parallel resonant circuit 26b is adjusted to equalize the resonant frequency of the second parallel resonant circuit 26b at the time the second PIN diode 28b is turned off with the central frequency of the second antenna switch 10B.

When the first switch circuits 22a are turned on, i.e., when all the first PIN diodes are turned on, the resistance between the first junctions a1 and GND is represented by a resistance which is lower than one ON resistance. As can be understood from the equation (e) above, the impedance at the end on the first signal line 34a side of the first λ/4 transmission line 24a is an impedance higher than with one ON resistance. The switch circuits thus approach an ideal open state.

Conversely, when the first switch circuits 22a are turned off, i.e., when all the first PIN diodes are turned off, only parallel resistances, which are high, are connected between the first junctions a1 and GND. As can be understood from the equation (e) above, the impedance at the end on the first signal line 34a side of the first λ/4 transmission line 24a is a low impedance depending on the high resistance. In other words, the insertion loss of the switch circuits upon signal transmission can further be reduced.

The second antenna switch 10B may employ the same configuration as the antenna switch 10Aa and the antenna switch 10Ab.

In the above embodiment, the two first λ/4 signal transmission lines 18a are connected in series to the first signal line 34a, and the two second λ/4 signal transmission lines 18b are connected in series to the second signal line 34b. Alternatively, three or more first λ/4 signal transmission lines 18a may be connected in series to the first signal line 34a, and three or more second λ/4 signal transmission lines 18b may be connected in series to the second signal line 34b.

If switch circuits are provided in multiple stages as described above, then the parallel resonant circuits may be dispensed with except for at least one switch circuit connected to the first signal line 34a and at least one switch circuit connected to the second signal line 34b. In the switch circuits where the parallel resonant circuits are dispensed with, the phase characteristic of the λ/4 transmission line suffers an error. However, the loss can be reduced by adjusting the characteristic impedance of the λ/4 transmission line, and the circuits can be simplified. Which one of the configurations is to be employed may be determined depending on demands, specifications, etc.

In the above embodiments, the central frequency fo of the operating frequency band has mainly been described. Actually, the above advantages are offered at each of the frequencies contained in the operating frequency band.

Figure 10:
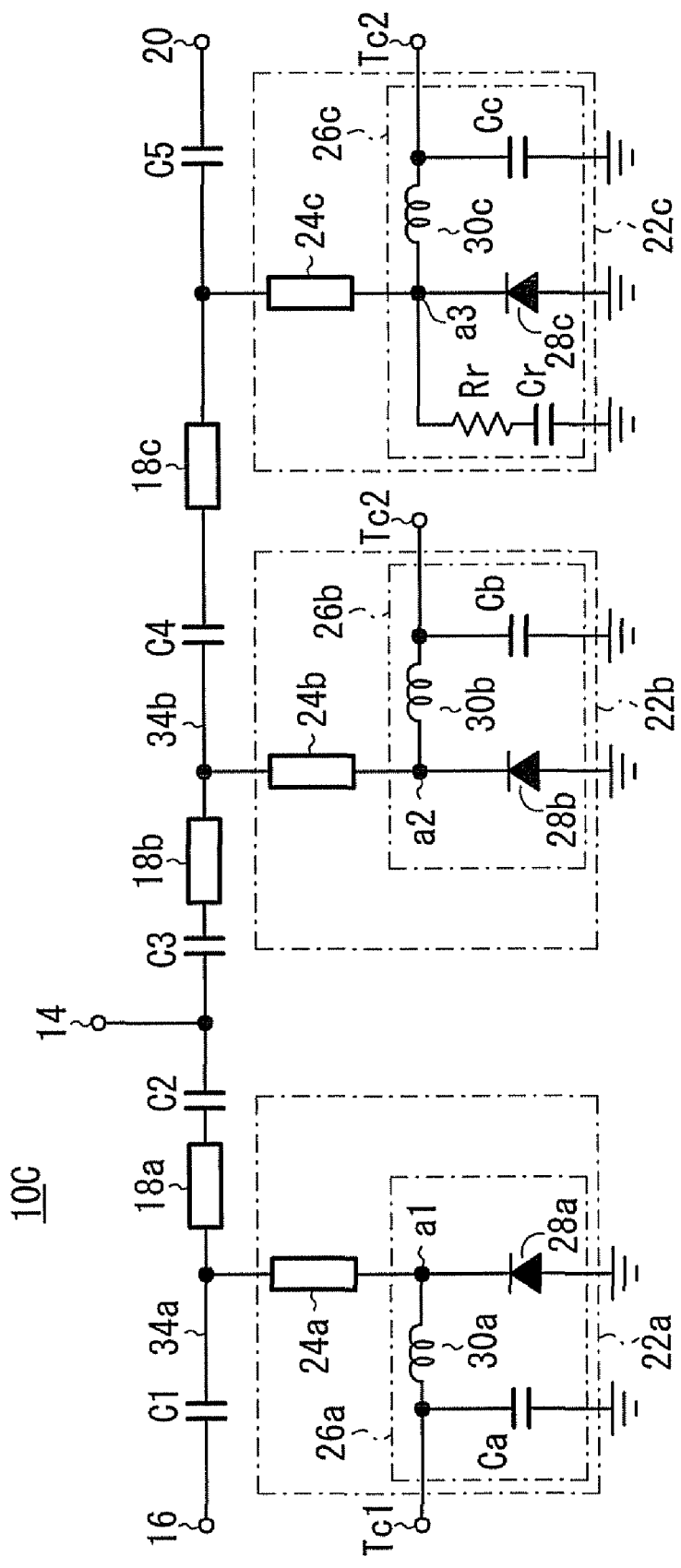
FIG. 10 is a circuit diagram showing a configuration of a third antenna switch.

As shown in FIG. 10, an antenna switch according to a third embodiment (hereinafter referred to as a third antenna switch 10C) is of a configuration substantially similar to the first antenna switch 10A described above, but is different therefrom in that it has a third λ/4 signal transmission line 18c connected between the second λ/4 signal transmission line 18b and the reception terminal 20, and a third switch circuit 22c connected parallel to the third λ/4 signal transmission line 18c. Capacitors C4, C5 are connected in series respectively between the second λ/4 signal transmission line 18b and the third λ/4 signal transmission line 18c and between the third λ/4 signal transmission line 18c and the reception terminal 20. As with the capacitors C1 through C3, the capacitors C4, C5 are capacitors for blocking currents for turning on and off PIN diodes, to be described later, and operate as a short circuit at high frequencies.

As with the second switch circuit 22b, the third switch circuit 22c is connected between a signal line between the third λ/4 signal transmission line 18c and the capacitor C5 and GND (ground). The third switch circuit 22c comprises a series-connected circuit of a third λ/4 transmission line 24c and a third parallel resonant circuit 26c which are connected in series to each other at a third junction a3.

The third parallel resonant circuit 26c comprises a third PIN diode 28c connected between the third junction a3 and GND, a third inductor 30c connected between the third junction a3 and a second control terminal Tc2, and a third capacitor Cc connected between the second control terminal Tc2 and GND. The third capacitor Cc operates as a capacitor for blocking currents for turning on and off the third PIN diode 28c.

The third switch circuit 22c also includes a series-connected circuit of a resistor Rr for forming a reception terminating resistance and a capacitor Cr, connected parallel to the third PIN diode 28c. The capacitor Cr operates as a capacitor for blocking currents for turning on and off the third PIN diode 28c.

To the second control terminals Tc2, there are applied the forward bias voltage Vc1 for passing a forward current through the second PIN diode 28b and the third PIN diode 28c to turn on the second PIN diode 28b and the third PIN diode 28c and the reverse bias voltage Vc2 for reversely biasing the second PIN diode 28b and the third PIN diode 28c to turn off the second PIN diode 28b and the third PIN diode 28c. When the forward bias voltage Vc1 is applied to the first control terminal Tc1, the reverse bias voltage Vc2 is applied to the second control terminals Tc2. When the reverse bias voltage Vc2 is applied to the first control terminal Tc1, the forward bias voltage Vc1 is applied to the second control terminals Tc2. The reverse bias voltage Vc2 which is applied to the first control terminal Tc1 and the reverse bias voltage Vc2 which is applied to the second control terminals Tc2 may have different voltage levels.

Figure 11A:
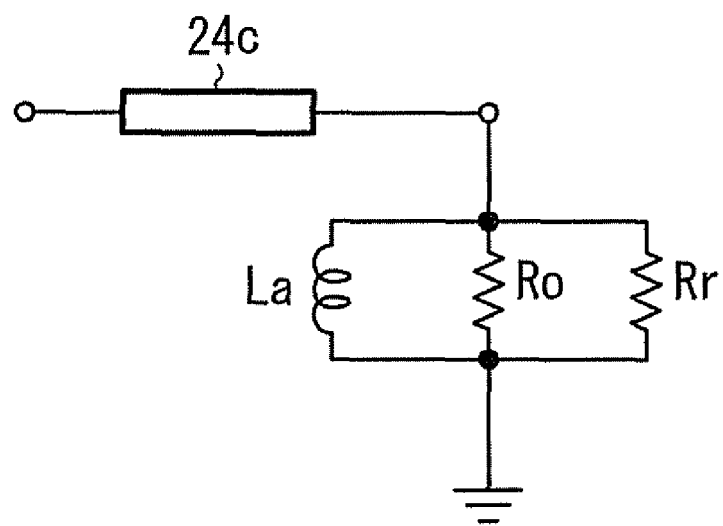
FIG. 11A is a diagram showing an equivalent circuit of a third switch circuit of the third antenna switch when a third PIN diode is turned on, and FIG. 11B is a diagram showing an equivalent circuit of the third switch circuit when the third PIN diode is turned off.
Figure 11B:
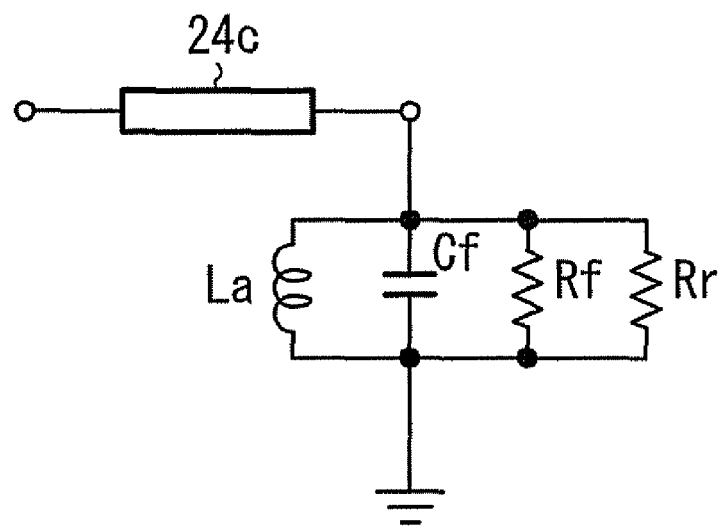

Circuit operation of the third antenna switch 10C will be described below with reference to FIGS. 11A through 12. Since operation of the first switch circuit 22a and the second switch circuit 22b has been described above, the third switch circuit 22c will primarily be described below.

When the forward bias voltage Vc1 is applied to the second control terminal Tc2, the third PIN diode 28c is turned on. At this time, the third switch circuit 22c is represented by an equivalent circuit shown in FIG. 11A. Specifically, a circuit comprising an inductance La, an ON resistance Ro of the third PIN diode 28c, and the resistor Rr for forming a reception terminating resistance which are connected parallel to each other is connected in series between the third λ/4 transmission line 24c and GND.

Conversely, when the reverse bias voltage Vc2 is applied to the second control terminal Tc2, the third PIN diode 28c is turned off. At this time, the third switch circuit 22c is represented by an equivalent circuit shown in FIG. 11B. Specifically, a parallel resonant circuit comprising an inductance La, a parasitic capacitance Cf due to the depletion layer of the third PIN diode 28c, a parallel resistance Rf of the third PIN diode 28c, and the resistor Rr for forming a reception terminating resistance which are connected parallel to each other is connected in series between the third λ/4 transmission line 24c and GND.

In this case, the inductance La also has a value established such that the central frequency fo of the first antenna switch 10A and the resonant frequency of the parallel resonant circuit that is made up of the parasitic capacitance Cf, the parallel resistance Rf, and the inductance La are in agreement with each other.

As described above, the third switch circuit 22c is of a configuration including the parallel-connected resistor Rr for forming a reception terminating resistance. Since the ON resistance Ro and the resistor Rr have a magnitude relationship of Ro<<Rr, the resistor Rr does not affect the operation of the third switch circuit 22c when the third PIN diode 28c is turned on. Since the parallel resistance Rf and the resistor Rr have a magnitude relationship of Rf>>Rr, the impedance on the signal line side is determined by the resistor Rr.

Specifically, if the characteristic impedance of the third λ/4 transmission line 24c is of 50 ohms and the resistor Rr for forming a reception terminating resistance is of 50 ohms, then the combined resistance (Rf//Rr) of the parallel resistance Rf (e.g., 10 k ohms) and the resistor Rr is of 49.751 ohms. The impedance of the third λ/4 transmission line 24c on the signal line side is terminated with 50×50/49.751=50.250 ohms according to the equation (e) (the terminating resistance is of 50.250 ohms). Actually, the value of the resistor Rr is determined so that the terminating resistance is of 50 ohms, for example.

When the third PIN diode 28c is turned on, if the ON resistance Ro=1 ohm, then since the combined resistance (Ro//Rr) of the ON resistance Ro and the resistor Rr is of 0.9804 ohm, the impedance of the third λ/4 transmission line 24c on the signal line side is of 50×50/0.9804=2550 ohms according to the equation (e).

Figure 12:
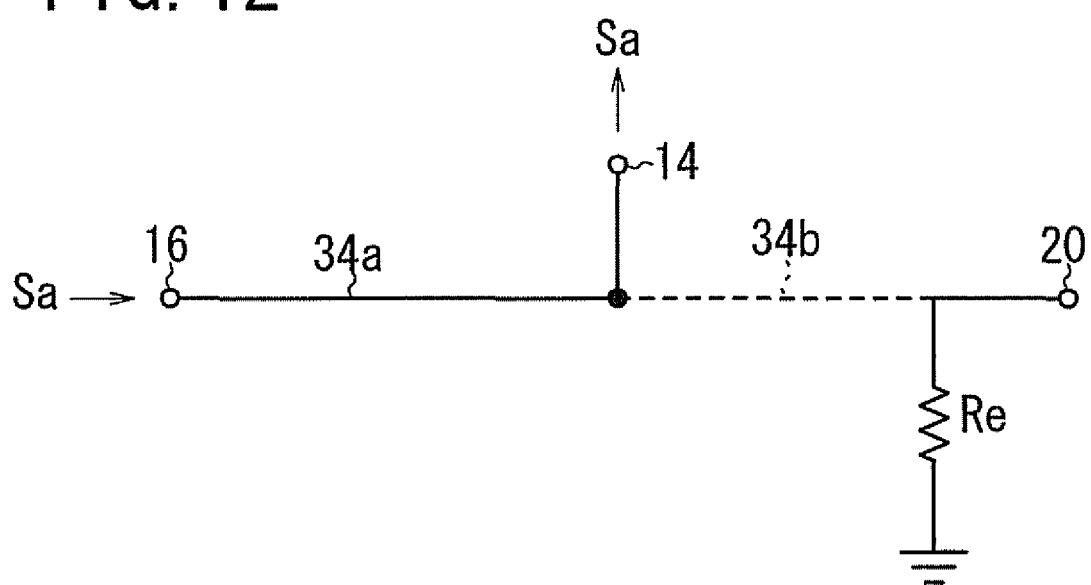
FIG. 12 is a diagram showing an equivalent circuit of the third antenna switch when a first switch circuit is turned on and a second switch circuit and the third switch circuit are turned off.

Therefore, when the forward bias voltage Vc1 is applied to the first control terminal Tc1, turning on the first PIN diode 28a, and the reverse bias voltage Vc2 is applied to the second control terminal Tc2, turning off the second PIN diode 28b and the third PIN diode 28c, the third antenna switch 10C is represented by an equivalent circuit shown in FIG. 12 wherein only the transmission terminal 16 is connected to the antenna connection terminal 14 at high frequencies, and a terminating resistor Re of 50 ohms, for example, is connected to the reception terminal 20. A transmission signal Sa supplied to the transmission terminal 16 is thus transmitted via the antenna connection terminal 14. In other words, a first signal line 34a from the transmission terminal 16 to the antenna connection terminal 14 serves as a signal transmission side, and a second signal line 34b from the reception terminal 20 to the antenna connection terminal 14 serves as a signal cutoff side.

If the third switch circuit 22c were not present, then the impedance of the second λ/4 transmission line 24b on the signal line side would be of a small value, and the signal line is ideally in a short-circuited state, as described above. In other words, since the impedance on the receiver side when the switch is turned off is of 0 ohm, resulting in total reflection, the reception amplifier connected to the reception terminal 20 may become unstable in operation.

Inasmuch as the third antenna switch 10C includes the third switch circuit 22c, the impedance on the receiver side when the switch is turned off is of the value of the terminating resistor Re, e.g., 50 ohms, thereby allowing the third antenna switch 10C to achieve impedance matching with other circuits. Therefore, the reception amplifier connected to the reception terminal 20 is rendered stable in operation.

Conversely, when the reverse bias voltage Vc2 is applied to the first control terminal Tc1, turning off the first PIN diode 28a, and the forward bias voltage Vc1 is applied to the second control terminal Tc2, turning on the second PIN diode 28b and the third PIN diode 28c, the third antenna switch 10C is represented by the equivalent circuit shown in FIG. 6 wherein only the reception terminal 20 is connected to the antenna connection terminal 14 at high frequencies, and a reception signal Sb received by the antenna is thus supplied to the antenna connection terminal 14 and output from the reception terminal 20. In other words, the first signal line 34a from the transmission terminal 16 to the antenna connection terminal 14 serves as a signal cutoff side, and the second signal line 34b from the reception terminal 20 to the antenna connection terminal 14 serves as a signal transmission side. Therefore, the resistor Rr does not affect reception of the signal.

Modifications of the third antenna switch 10C will be described below with reference to FIGS. 13 and 14.

Figure 13:
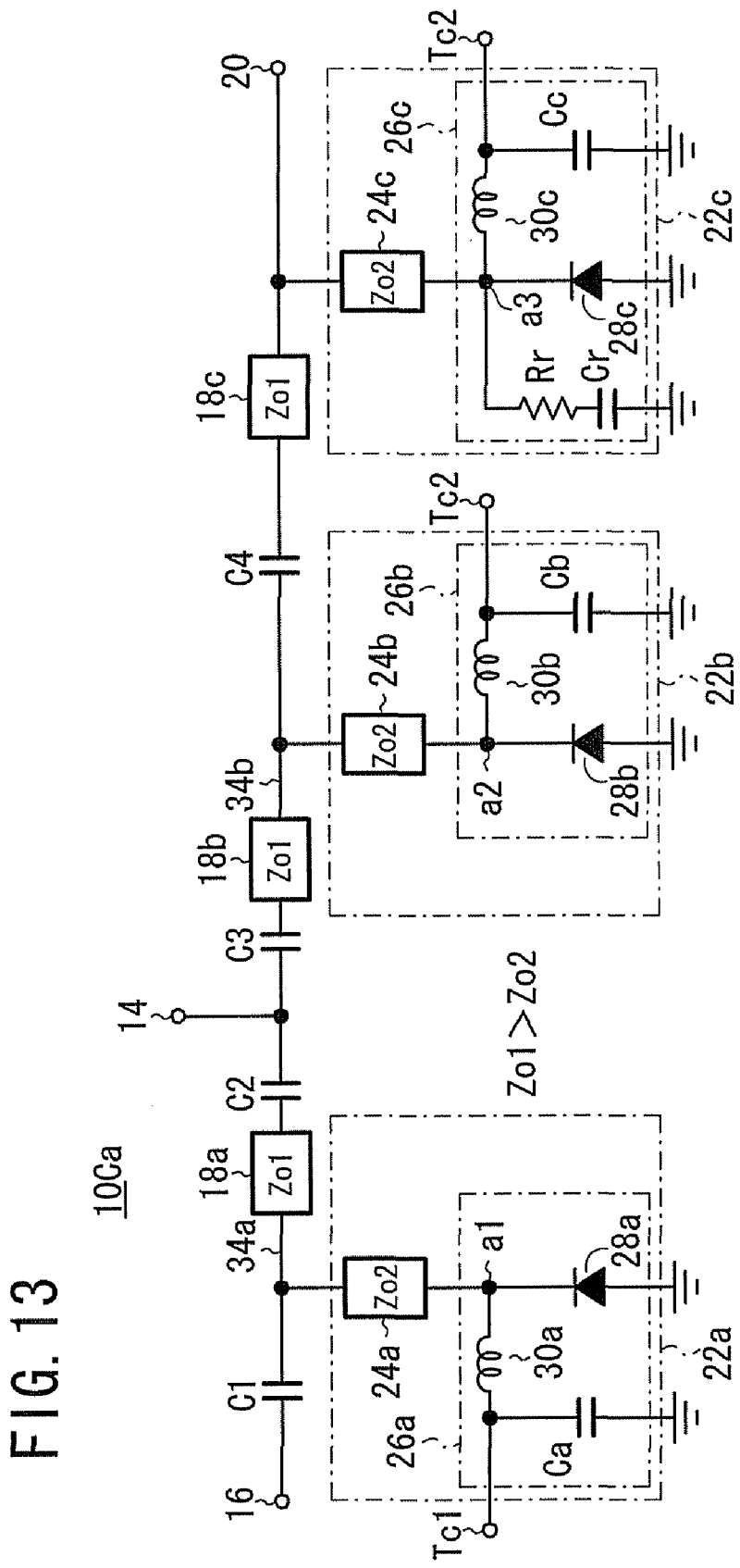
FIG. 13 is a circuit diagram showing a configuration of a first modification of the third antenna switch.

As shown in FIG. 13, an antenna switch 10Ca according to a first modification resides in that respective characteristic impedances Zo2 of the first λ/4 transmission line 24a through third λ/4 transmission line 24c are lower than respective characteristic impedances Zo1 (e.g., 50 ohms) of the first λ/4 signal transmission line 18a through third λ/4 signal transmission line 18c (Zo1>Zo2).

With the antenna switch 10Ca, as with the antenna switch 10Aa, the impedance at the end on the first signal line 34a side of the first λ/4 transmission line 24a is smaller than when the characteristic impedance Zo2 of the first λ/4 transmission line 24a and the characteristic impedance Zo1 of the first λ/4 signal transmission line 18a are the same as each other. The switch circuit thus approaches an ideal short-circuited state.

With the antenna switch 10Ca, therefore, the isolation at the time the first PIN diode 28a through the third PIN diode 28c are turned off, in particular, the isolation between the antenna connection terminal 14 and the transmission terminal 16 or the isolation between the antenna connection terminal 14 and the reception terminal 20 is expanded for efficiently cutting off a reception signal upon transmission and a transmission signal upon reception. Moreover, the impedance on the receiver side when the switch is turned off is made closer to the ideal value of the terminating resistor Re, e.g., 50 ohms, thereby making the reception amplifier connected to the reception terminal 20 more stable in operation.

Figure 14:
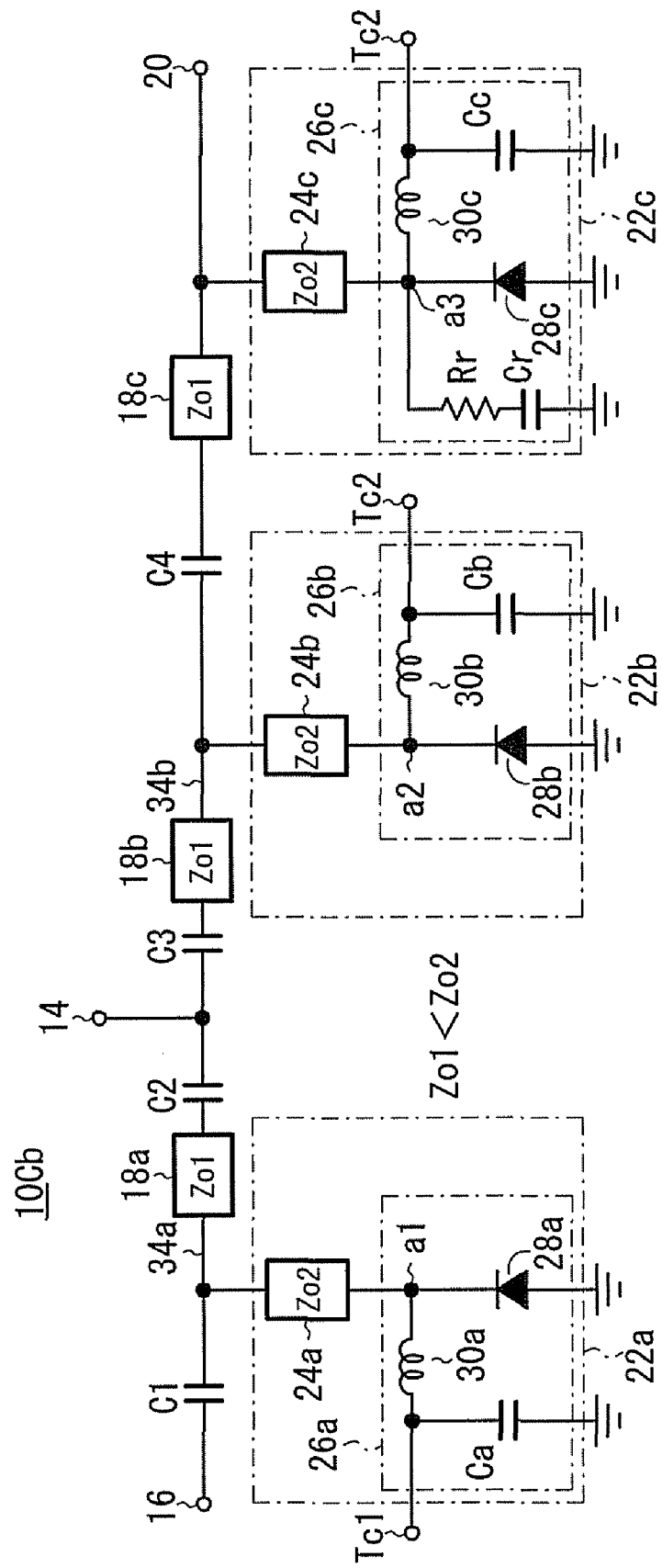
FIG. 14 is a circuit diagram showing a configuration of a fourth modification of the third antenna switch.

As shown in FIG. 14, an antenna switch 10Cb according to a second modification resides in that respective characteristic impedances Zo2 of the first λ/4 transmission line 24a through third λ/4 transmission line 24c are higher than respective characteristic impedances Zo1 (e.g., 50 ohms) of the first λ/4 signal transmission line 18a through third λ/4 signal transmission line 18c (Zo1<Zo2).

With the antenna switch 10Cb, as with the antenna switch 10Ab, the impedance at the end on the first signal line 34a side of the first λ/4 transmission line 24a is greater than when the characteristic impedance Zo2 of the first λ/4 transmission line 24a and the characteristic impedance Zo1 of the first λ/4 signal transmission line 18a are the same as each other. The switch circuit thus approaches an ideal open state.

The antenna switch 10Cb is thus capable of minimizing the insertion loss caused when the first PIN diode 28a through the third PIN diode 28c are turned on, in particular, the insertion loss between the antenna connection terminal 14 and the transmission terminal 16 or the insertion loss between the antenna connection terminal 14 and the reception terminal 20, for efficiently transferring a transmission signal and a reception signal. Moreover, the impedance on the receiver side when the switch is turned off is made closer to the ideal value of the terminating resistor Re, e.g., 50 ohms, thereby making the reception amplifier connected to the reception terminal 20 more stable in operation.

As described above, the antenna switch 10Ca is effective to expand the isolation of the signal lines wherein the PIN diodes are turned off, and the antenna switch 10Cb is effective to reduce the insertion loss of the signal lines wherein the PIN diodes are turned on. Which one of the configurations is to be employed may be determined depending on demands, specifications, etc.

Figure 15:
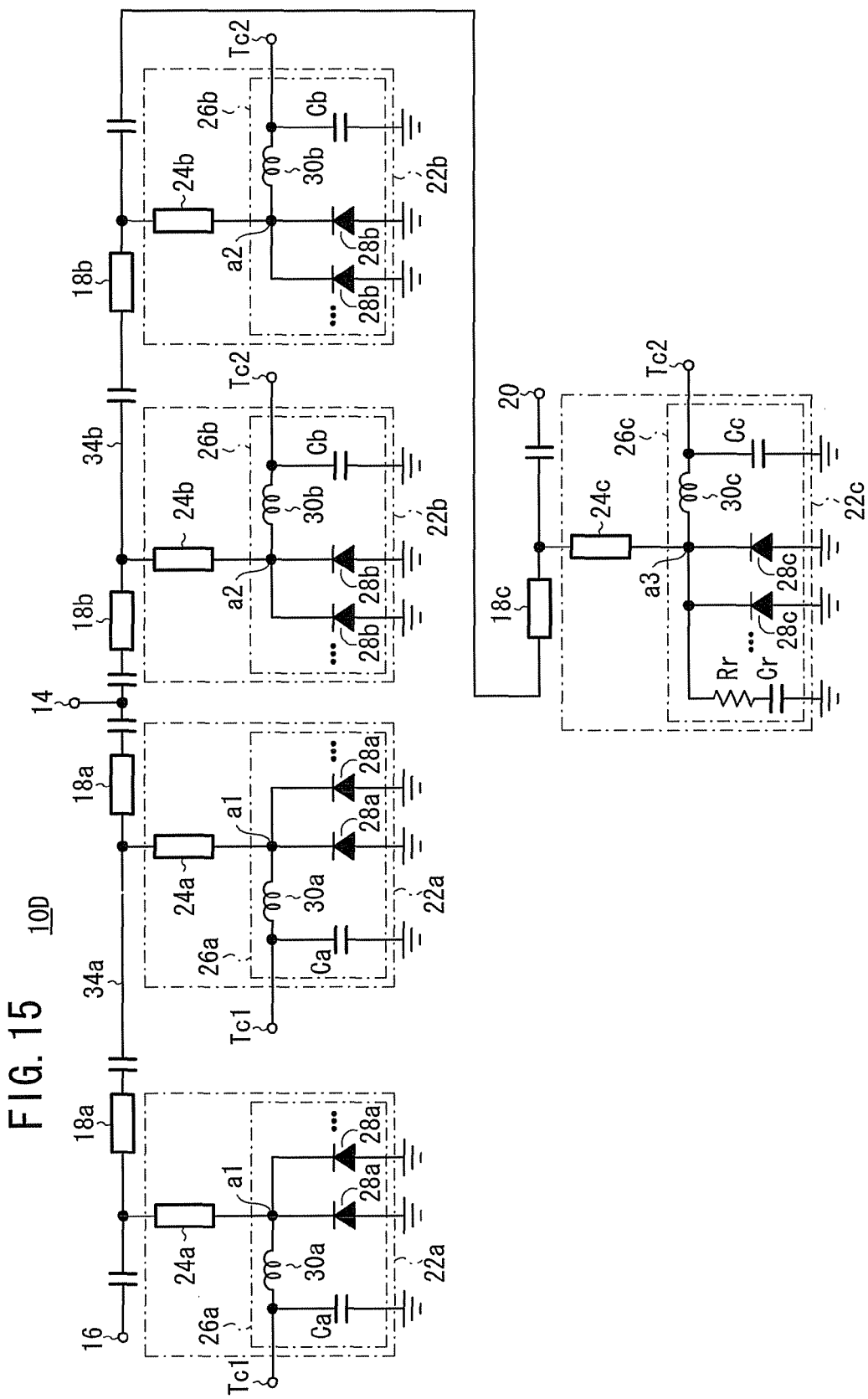
FIG. 15 is a circuit diagram showing a configuration of a fourth antenna switch.

An antenna switch according to a fourth embodiment (hereinafter referred to as a fourth antenna switch 10D) will be described below with reference to FIG. 15.

The fourth antenna switch 10D is of a configuration which is substantially similar to the third antenna switch 10C described above, but is different therefrom as follows:

Two first λ/4 signal transmission lines 18a are connected between an antenna connection terminal 14 and a transmission terminal 16, and two second λ/4 signal transmission lines 18b and a third λ/4 signal transmission line 18c are connected between the antenna connection terminal 14 and a reception terminal 20.

First switch circuits 22a are connected in association with the respective first λ/4 signal transmission lines 18a, and, similarly, second switch circuits 22b are connected in association with the respective second λ/4 signal transmission lines 18b and a third switch circuit 22c is connected in association with the third λ/4 signal transmission line 18c.

Furthermore, the first parallel resonant circuit 26a of each of the first switch circuits 22a has a plurality of parallel first PIN diodes 28a, the second parallel resonant circuit 26b of each of the second switch circuits 22b has a plurality of parallel second PIN diodes 28b, and the third parallel resonant circuit 26c of the third switch circuit 22c has a plurality of parallel third PIN diodes 28c.

In this case also, the constant of the first inductor 30a of the first parallel resonant circuit 26a is adjusted to equalize the resonant frequency of the first parallel resonant circuit 26a at the time the first PIN diode 28a is turned off with the central frequency of the second antenna switch 10B. Similarly, the constants of the second inductor 30b of the second parallel resonant circuit 26b and the third inductor 30c of the third parallel resonant circuit 26c are adjusted to equalize the resonant frequencies of the second parallel resonant circuit 26b and the third parallel resonant circuit 26c at the time the second PIN diode 28b and the third PIN diode 28c are turned off with the central frequency of the fourth antenna switch 10D.

When the first switch circuits 22a are turned on, i.e., when all the first PIN diodes 28a are turned on, the resistance between the first junctions a1 and GND is represented by a resistance which is lower than one ON resistance. As can be understood from the equation (e) above, the impedance at the end on the first signal line 34a side of the first λ/4 transmission line 24a is an impedance higher than with one ON resistance. The switch circuits thus approach an ideal open state.

Conversely, when the first switch circuits 22a are turned off, i.e., when all the first PIN diodes 28a are turned off, only parallel resistances, which are high, are connected between the first junctions a1 and GND. As can be understood from the equation (e) above, the impedance at the end on the first signal line 34a side of the first λ/4 transmission line 24a is a low impedance depending on the high resistance. In other words, the insertion loss of the switch circuits upon signal transmission can further be reduced.

The fourth antenna switch 10D may employ the same configuration as the antenna switch 10Ca and the antenna switch 10Cb.

In the above embodiment, the two first λ/4 signal transmission lines 18a are connected in series to the first signal line 34a, and the two second λ/4 signal transmission lines 18b are connected in series to the second signal line 34b. Alternatively, three or more first λ/4 signal transmission lines 18a may be connected in series to the first signal line 34a, and three or more second λ/4 signal transmission lines 18b may be connected in series to the second signal line 34b.

If switch circuits are provided in multiple stages as described above, then the parallel resonant circuits may be dispensed with except for at least one switch circuit connected to the first signal line 34a and at least one switch circuit connected to the second signal line 34b. In the switch circuits where the parallel resonant circuits are dispensed with, the phase characteristic of the λ/4 transmission line suffers an error. However, the loss can be reduced by adjusting the characteristic impedance of the λ/4 transmission line, and the circuits can be simplified. Which one of the configurations is to be employed may be determined depending on demands, specifications, etc.

Figure 16:
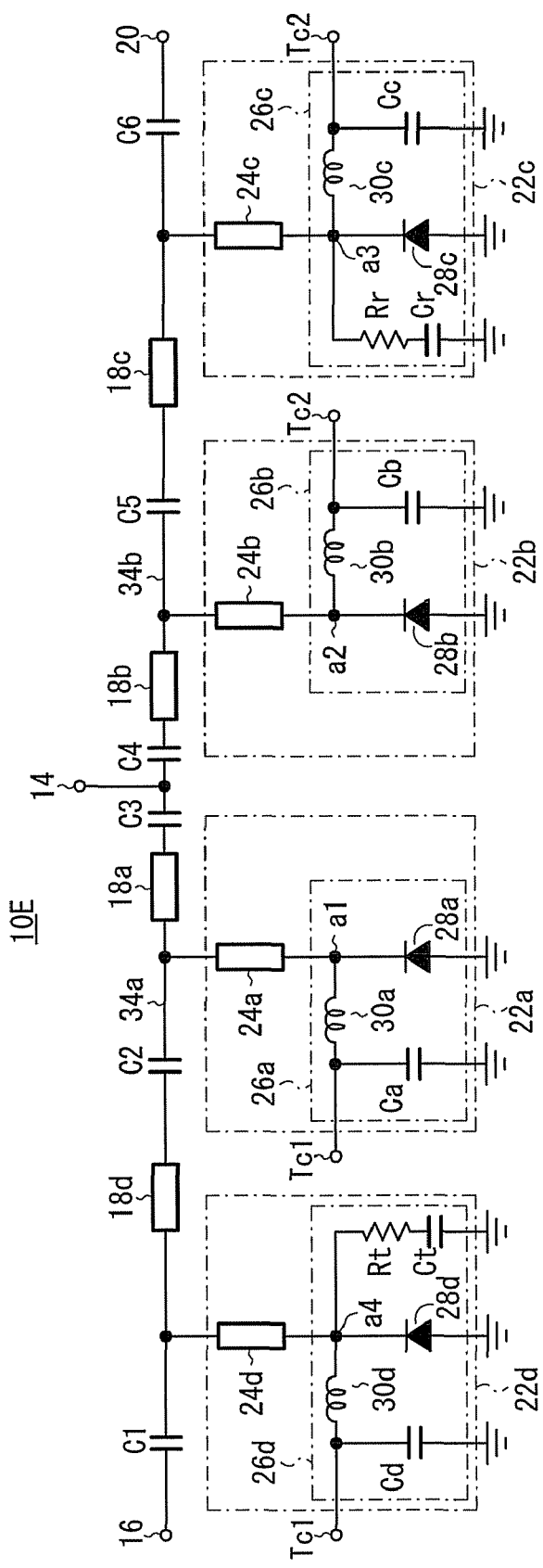
FIG. 16 is a circuit diagram showing a configuration of a fifth antenna switch.

An antenna switch according to a fifth embodiment (hereinafter referred to as a fifth antenna switch 10E) will be described below with reference to FIG. 16.

The fifth antenna switch 10E is of a configuration which is substantially similar to the third antenna switch 10C described above, but is different therefrom as follows:

The fifth antenna switch 10E has a fourth λ/4 signal transmission line 18d connected between the first λ/4 signal transmission line 18a and the transmission terminal 16 and a fourth switch circuit 22d connected parallel to the fourth λ/4 signal transmission line 18d.

The fourth switch circuit 22d is connected between a signal line between the fourth λ/4 signal transmission line 18d and a capacitor C1 and GND (ground). The fourth switch circuit 22d comprises a series-connected circuit of a fourth λ/4 transmission line 24d and a fourth parallel resonant circuit 26d which are connected in series to each other at a fourth junction a4.

The fourth parallel resonant circuit 26d comprises a fourth PIN diode 28d connected between the fourth junction a4 and GND, a fourth inductor 30d connected between the fourth junction a4 and a first control terminal Tc1, and a fourth capacitor Cd connected between the first control terminal Tc1 and GND. The fourth capacitor Cd operates as a capacitor for blocking currents for turning on and off the fourth PIN diode 28d.

The fourth switch circuit 22d also includes a series-connected circuit of a resistor Rt for forming a transmission terminating resistance and a capacitor Ct, which is connected parallel to the fourth PIN diode 28d.

The fourth switch circuit 22d is thus of a configuration identical to the third switch circuit 22c on the receiver side.

Therefore, when the forward bias voltage Vc1 is applied to the first control terminal Tc1, turning on the first PIN diode 28a and the fourth PIN diode 28d, and the reverse bias voltage Vc2 is applied to the second control terminal Tc2, turning off the second PIN diode 28b and the third PIN diode 28c, the fifth antenna switch 10E is represented by the equivalent circuit shown in FIG. 12 wherein only the transmission terminal 16 is connected to the antenna connection terminal 14 at high frequencies, and a terminating resistor of 50 ohms, for example, is connected to the reception terminal 20. In this case, the impedance on the receiver side when the switch is turned off is of the value of the terminating resistor Re, e.g., 50 ohms, thereby allowing the fifth antenna switch 10E to achieve impedance matching with other circuits. Therefore, the reception amplifier connected to the reception terminal 20 is rendered stable in operation.

Figure 17:
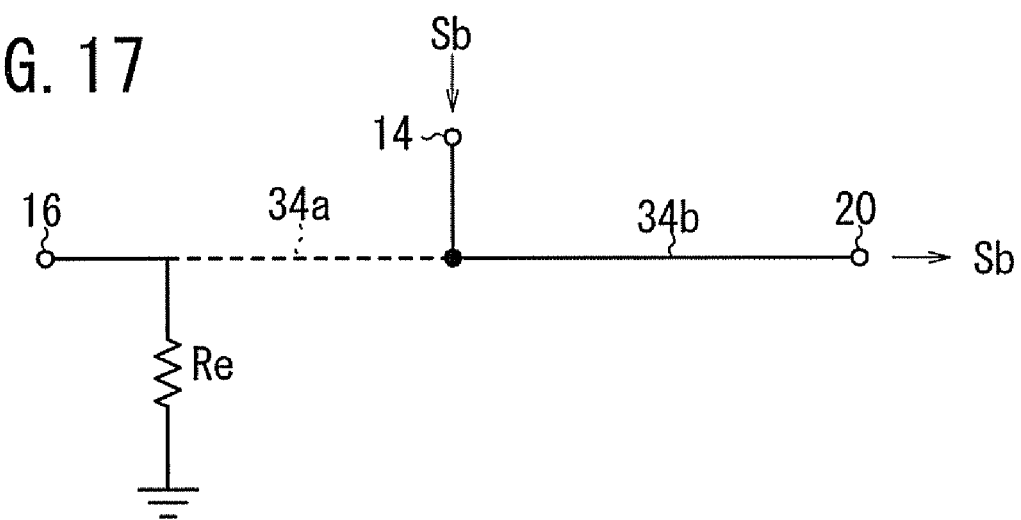

Conversely, when the reverse bias voltage Vc2 is applied to the first control terminal Tc1, turning off the first PIN diode 28a and the fourth PIN diode 28d, and the forward bias voltage Vc1 is applied to the second control terminal Tc2, turning on the second PIN diode 28b and the third PIN diode 28c, the fifth antenna switch 10E is represented by an equivalent circuit shown in FIG. 17 wherein only the reception terminal 20 is connected to the antenna connection terminal 14 at high frequencies, and a terminating resistor Re of, for example, 50 ohms is connected to the transmission terminal 16. In this case, the impedance on the transmitter side when the switch is turned off is of the value of the terminating resistor Re, e.g., 50 ohms, thereby allowing the fifth antenna switch 10E to achieve impedance matching with other circuits.

The fifth antenna switch 10E may employ the same configuration as the antenna switch 10Ca, the antenna switch 10Cb, and the fourth antenna switch 10D.

In the above embodiments, the central frequency fo of the operating frequency band has mainly been described. Actually, the above advantages are offered at each of the frequencies contained in the operating frequency band.

Figure 18:
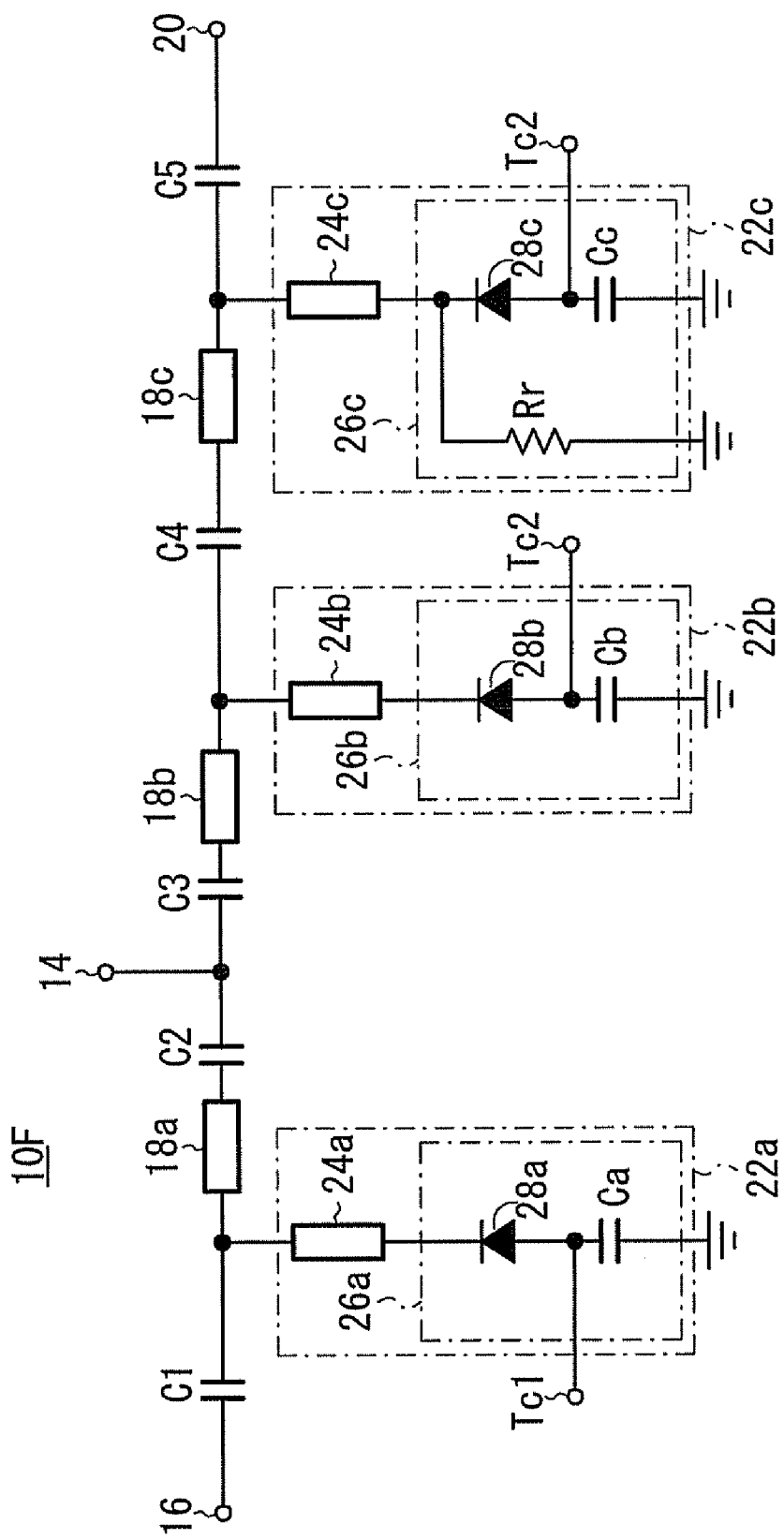
FIG. 18 is a circuit diagram showing a configuration of a sixth antenna switch.
Figure 19:
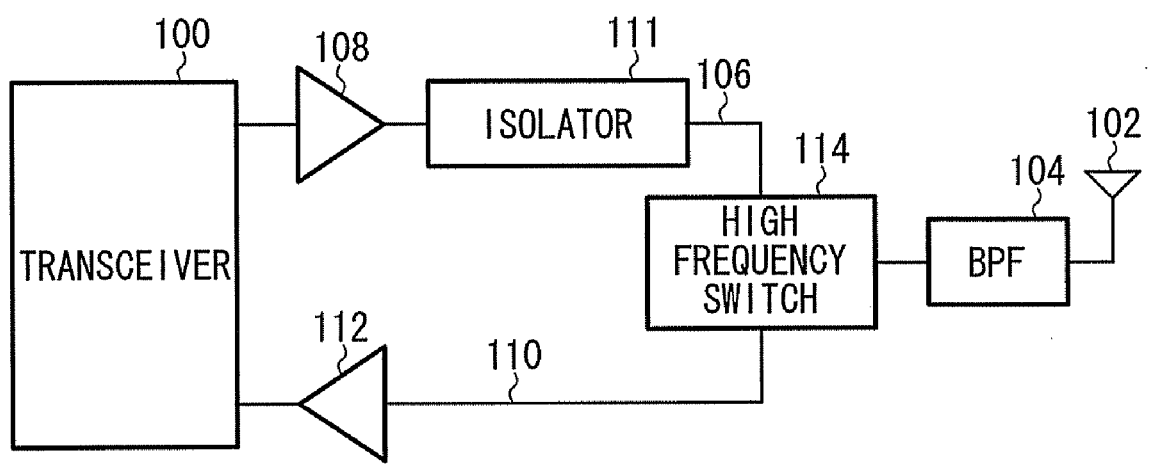
FIG. 19 is a diagram illustrative of a first transmission and reception scheme using a high frequency switch.
Figure 20:
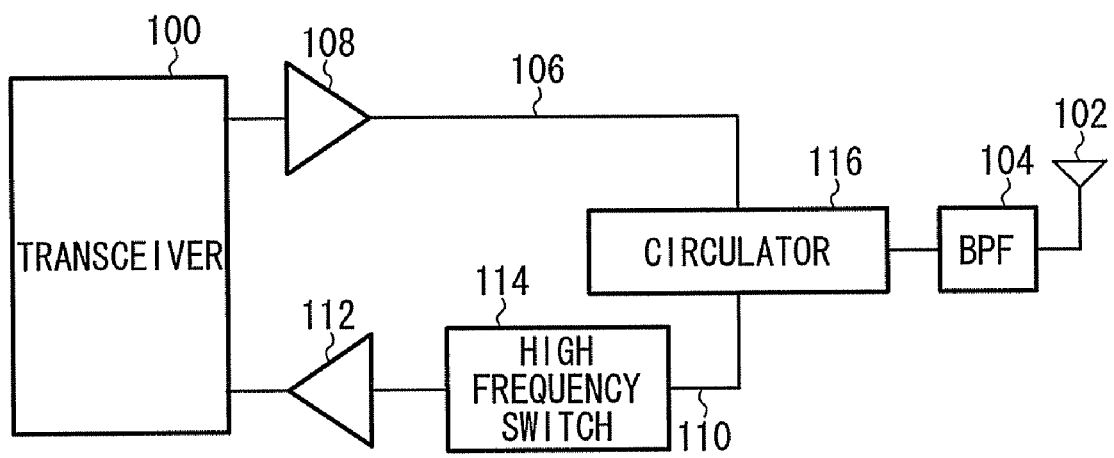
FIG. 20 is a diagram illustrative of a second transmission and reception scheme using a high frequency switch.

An antenna switch according to a sixth embodiment (hereinafter referred to as a sixth antenna switch 10F) will be described below with reference to FIG. 18.

The sixth antenna switch 10F is of a configuration which is substantially similar to the third antenna switch 10C described above, but has a first switch circuit 22a through a third switch circuit 22c which are different therefrom in configuration as follows:

The first switch circuit 22a comprises a series-connected circuit of a first PIN diode 28a and a first capacitor Ca, connected between a first λ/4 transmission line 24a and GND, and a first control terminal Tc1 connected to the junction between the first PIN diode 28a and the first capacitor Ca.

The second switch circuit 22b comprises a series-connected circuit of a second PIN diode 28b and a second capacitor Cb, connected between a second transmission line 24b and GND, and a second control terminal Tc2 connected to the junction between the second PIN diode 28b and the second capacitor Cb.

The third switch circuit 22c comprises a series-connected circuit of a third PIN diode 28c and a third capacitor Cc, connected between a third λ/4 transmission line 24c and GND, a second control terminal Tc2 connected to the junction between the third PIN diode 28c and the third capacitor Cc, and a resistor Rr for forming a reception terminating resistance, connected between the cathode of the third PIN diode 28c and GND.

Therefore, when the forward bias voltage Vc1 is applied to the first control terminal Tc1, turning on the first PIN diode 28a, and the reverse bias voltage Vc2 is applied to the second control terminal Tc2, turning off the second PIN diode 28b and the third PIN diode 28c, the sixth antenna switch 10F is represented by the equivalent circuit shown in FIG. 12 wherein only the transmission terminal 16 is connected to the antenna connection terminal 14 at high frequencies, and a terminating resistor Re of, for example, 50 ohms is connected to the reception terminal 20. In this case, the impedance on the receiver side when the switch is turned off is of the value of the terminating resistor Re, e.g., 50 ohms, thereby allowing the sixth antenna switch 10F to achieve impedance matching with other circuits. Therefore, the reception amplifier connected to the reception terminal 20 is rendered stable in operation.

Conversely, when the reverse bias voltage Vc2 is applied to the first control terminal Tc1, turning off the first PIN diode 28a, and the forward bias voltage Vc1 is applied to the second control terminal Tc2, turning on the second PIN diode 28b and the third PIN diode 28c, the sixth antenna switch 10F is represented by the equivalent circuit shown in FIG. 6 wherein only the reception terminal 20 is connected to the antenna connection terminal 14 at high frequencies.

The equivalent circuit of the sixth antenna switch 10F in the vicinity of the central frequency fo when the first PIN diode 28a is turned off, is not the same as shown in FIG. 3B, but includes a parasitic capacitance Cf which remains as shown in FIG. 2B, thereby shifting the resonant frequency into a low frequency range. Thus, the sixth antenna switch 10F is poorer in performance than the third antenna switch 10C. However, since the sixth antenna switch 10F is structurally simple, it is effective in applications where small size and lower cost are preferable to performance.

The sixth antenna switch 10F may employ the same configuration as the antenna switch 10Ca, the antenna switch 10Cb, the fourth antenna switch 10D, and the fifth antenna switch 10E.

The high frequency switch according to the present invention is not limited to the above embodiments, but may adopt various configurations without departing from the scope of the invention.

The invention claimed is:

1. A high frequency switch including a first switch circuit connected parallel to a first λ/4 signal transmission line for transmitting signal from a transmission terminal, the first switch circuit comprising a first λ/4 transmission line and a circuit including one or more first PIN diode, the first λ/4 transmission line and the circuit being connected in series to each other, and a second switch circuit connected parallel to a second λ/4 signal transmission line for receiving signal by a reception terminal, the second switch circuit comprising a second λ/4 transmission line and a circuit including one or more second PIN diode, the second λ/4 transmission line and the circuit being connected in series to each other, the high frequency switch comprising:
   a third switch circuit connected parallel to a third λ/4 signal transmission line connected at least between the reception terminal and the second λ/4 signal transmission line, the third switch circuit comprising a third λ/4 transmission line and a circuit including one or more third PIN diode, the third λ/4 transmission line and the circuit being connected in series to each other; and
   a resistor for forming a terminating resistance, the resistor connected parallel to the third PIN diode.

2. A high frequency switch according to claim 1, comprising:
   a fourth switch circuit connected parallel to a fourth λ/4 signal transmission line connected between the transmission terminal and the first λ/4 signal transmission line, the fourth switch circuit comprising a fourth λ/4 transmission line and a circuit including one or more fourth PIN diode, the fourth λ/4 transmission line and the circuit being connected in series to each other; and
   a resistor for forming a terminating resistance, the resistor connected parallel to the fourth PIN diode.

3. A high frequency switch according to claim 1, wherein the high frequency switch has an operating frequency band with a central frequency fo and a wavelength λ corresponding to the central frequency fo;
   the first switch circuit comprises the first λ/4 transmission line and a parallel resonant circuit including the one or more first PIN diode, the first λ/4 transmission line and the parallel resonant circuit being connected in series to each other;
   the second switch circuit comprises the second λ/4 transmission line and a parallel resonant circuit including the one or more second PIN diode, the second λ/4 transmission line and the parallel resonant circuit being connected in series to each other; and
   the third switch circuit comprises the third λ/4 transmission line and a parallel resonant circuit including the one or more third PIN diode, the third λ/4 transmission line and the parallel resonant circuit being connected in series to each other;
   each of the parallel resonant circuits having a constant established such that the resonant frequency thereof when the corresponding one of the PIN diodes is turned off is the same as the central frequency fo.

4. A high frequency switch according to claim 2, wherein the high frequency switch has an operating frequency band with a central frequency fo and a wavelength λ corresponding to the central frequency fo;
   the first switch circuit comprises the first λ/4 transmission line and a parallel resonant circuit including the one or more first PIN diode, the first λ/4 transmission line and the parallel resonant circuit being connected in series to each other;
   the second switch circuit comprises the second λ/4 transmission line and a parallel resonant circuit including the one or more second PIN diode, the second λ/4 transmission line and the parallel resonant circuit being connected in series to each other;
   the third switch circuit comprises the third λ/4 transmission line and a parallel resonant circuit including the one or more third PIN diode, the third λ/4 transmission line and the parallel resonant circuit being connected in series to each other; and
   the fourth switch circuit comprises the fourth λ/4 transmission line and a parallel resonant circuit including the one or more fourth PIN diode, the fourth λ/4 transmission line and the parallel resonant circuit being connected in series to each other;
   each of the parallel resonant circuits having a constant established such that the resonant frequency thereof when the corresponding one of the PIN diodes is turned off is the same as the central frequency fo.

5. A high frequency switch according to claim 1, wherein the parallel resonant circuit includes a plurality of PIN diodes.

6. A high frequency switch according to claim 1, wherein the λ/4 transmission lines have a characteristic impedance which is smaller than a characteristic impedance of the λ/4 signal transmission lines.

7. A high frequency switch according to claim 1, wherein the λ/4 transmission lines have a characteristic impedance which is greater than a characteristic impedance of the λ/4 signal transmission lines.

* * * * *